United States Patent
Itoh

(10) Patent No.: US 7,036,056 B2
(45) Date of Patent: Apr. 25, 2006

(54) SEMICONDUCTOR MEMORY DEVICE HAVING TIME REDUCED IN TESTING OF MEMORY CELL DATA READING OR WRITING, OR TESTING OF SENSE AMPLIFIER PERFORMANCE

(75) Inventor: Takashi Itoh, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 428 days.

(21) Appl. No.: 10/342,396

(22) Filed: Jan. 15, 2003

(65) Prior Publication Data

US 2004/0030972 A1   Feb. 12, 2004

(30) Foreign Application Priority Data

Aug. 9, 2002   (JP) ............................. 2002-232853

(51) Int. Cl.
*G11C 29/00* (2006.01)

(52) U.S. Cl. ........................ 714/718; 365/200; 365/201
(58) Field of Classification Search ................ 365/200, 365/201; 714/718
See application file for complete search history.

(56) References Cited

U.S. PATENT DOCUMENTS

| | | | | | |
|---|---|---|---|---|---|
| 4,879,689 | A | * | 11/1989 | Atsumi et al. | 365/185.04 |
| 5,339,273 | A | * | 8/1994 | Taguchi | 365/201 |
| 5,495,448 | A | * | 2/1996 | Sachdev | 365/201 |
| 6,038,180 | A | * | 3/2000 | Hoshi | 365/201 |

FOREIGN PATENT DOCUMENTS

JP           7-287981          10/1995

* cited by examiner

*Primary Examiner*—Albert Decady
*Assistant Examiner*—Steve Nguyen
(74) *Attorney, Agent, or Firm*—McDermott Will & Emery LLP

(57) ABSTRACT

In a read out mode, a NAND circuit to which latch data of both bit lines are input provides an L output when potentials of the bit line pair are constantly identical, and provides an H output when the potentials of the bit line pair change, even when the word line rendered active is switched. In a writing mode, the NAND circuit provides an L output. In a reading mode, H is applied to the gate of a first transistor that connects a bit line BL with the NAND circuit. In a writing mode, H is applied to the gate of the first transistor or a second transistor that connects a bit line /BL with the NAND circuit. Potential change occurs at the bit line pair according to an output of the NAND circuit.

5 Claims, 22 Drawing Sheets

FIG.22A

| Δt | 10ns | 9ns | 8ns | 7ns | 6ns | 5ns | 4ns | 3ns | 2ns | 1ns |
|---|---|---|---|---|---|---|---|---|---|---|
| READ DATA | H | H | H | H | H | H | H | H | H | H |

FIG.22B

| Δt | 10ns | 9ns | 8ns | 7ns | 6ns | 5ns | 4ns | 3ns | 2ns | 1ns |
|---|---|---|---|---|---|---|---|---|---|---|
| READ DATA | H | H | H | H | H | H | H | H | L | L |

FIG.22C

| Δt | 10ns | 9ns | 8ns | 7ns | 6ns | 5ns | 4ns | 3ns | 2ns | 1ns |
|---|---|---|---|---|---|---|---|---|---|---|
| READ DATA | H | H | H | H | H | H | H | H | L | H |

SEMICONDUCTOR MEMORY DEVICE HAVING TIME REDUCED IN TESTING OF MEMORY CELL DATA READING OR WRITING, OR TESTING OF SENSE AMPLIFIER PERFORMANCE

BACKGROUND OF THE INVENTION

1. Field of the Invention

The present invention relates to semiconductor memory devices, particularly to a semiconductor memory device with testing capability.

2. Description of the Background Art

Reflecting the increased scale of integration of semiconductor memory devices, the testing time required to confirm the operation has becomes longer. The time required for testing is extremely increased if the pass/fail determination of memory cells are effected in units of 1 bit each. An approach to reduce the testing time is taken by carrying out the pass/fail determination for a plurality of memory cells at the same time. This method of testing in the units of several memory cells is called "multibit testing".

Multibit testing is described in detail in, for example, "Ultra LSI Memory", pp. 183–185 by Kiyoo Ito, published by Baihukan, 1994. A method of multibit testing will be described based on this document.

Referring to FIG. 23 showing the concept of multibit testing, a memory cell array 500 includes X×Y memory cells. Memory array 500 is divided into subarrays #1–#q. Each subarray includes a data input/output line pair GPIO 504, a write driver 503, and a preamplifier 501. One bit line pair is connected to GPIO for every subarray.

In a write operation, all write drivers 503 are rendered active. Test data sent from a terminal DQ0 is transferred to the bit line pair connected to GPIO. Accordingly, test data is written into all the q memory cells located at respective crossings between the bit line pair and activated word line. This is conducted on all word lines and bit line pairs.

In contrast to the general method in which test data is written for each memory cell (for each 1 bit) requiring a writing process of X×Y times, a writing process of only X×Y/q times is required in multibit testing. The writing time of test data can be reduced to 1/q.

In a read mode, all preamplifiers 501 are rendered active at the same time. Test data of the same value are read out simultaneously from the q memory cells located at the crossings of the bit line pair connected to GPIO and the activated word line. The read out test data are transferred to a NOR circuit 502. NOR circuit 502 outputs an H level (logical high) at a terminal DQ1 when all the transmitted data match, and outputs an L level (logical low) at terminal DQ1 when at least one does not match.

In contrast to the general method of reading out test data for every memory cell (for every 1 bit) requiring a read process of X×Y times, the read process is required only X×Y/q times in multibit testing. The time required for reading out test data can be reduced to 1/q.

In such a multibit testing, the time required for testing can further be reduced by increasing the number q of divided subarrays.

However, increasing the number q of subarrays will require a corresponding number of preamplifiers, write drivers, and GPIOs, whereby the circuit scale will become larger. According to the aforementioned document, it is estimated that the value of q in a memory array of X×Y=256 Mbits is 128 at most. With the ever increasing scale of integration in the field of semiconductor memory devices, the need to significantly reduce the testing time is noted.

When data is read out from a memory cell, the potential difference between paired bit lines is amplified by a sense amplifier. The potential difference between the bit lines applied to the sense amplifier may become small due to variation caused by noise or the like. It is desirable that the sense amplifier can properly amplify the potential difference even when of a small level caused by such variation. The need arises for the performance evaluation of whether the sense amplifier can amplify a small potential difference with a simple configuration.

SUMMARY OF THE INVENTION

An object of the present invention is to provide a semiconductor memory device of a simple structure that can write test data into a memory array in a short processing time, and a semiconductor memory device that can check whether test data has been properly read out from the memory array.

Another object of the present invention is to provide a semiconductor memory device that can conduct performance evaluation on a sense amplifier with a simple structure.

A semiconductor memory device according to an aspect of the present invention operates in a test mode to conduct testing of reading out memory cell data, includes a first circuit provided corresponding to a bit line pair having data of both bit lines of a relevant bit line pair respectively input for a plurality of times to output a first logic value when the data of each bit line input for the plurality of time are the same data, and output a second logic value when the data differ; a first control circuit sequentially rendering active a plurality of word lines connected to a plurality of memory cells such that data of a bit line pair corresponding to a memory cell is sequentially applied to the first circuit; and a second control circuit transferring an output of the first circuit to one bit line of a bit line pair, and providing data according to a potential of the relevant bit line pair outside the semiconductor memory device when processing under control of the first control circuit ends. Identification can be made whether the value output from the first circuit indicates a first logic value or a second logic value depending on the data provided outside the semiconductor memory device. Determination can be made whether the stored test data has been properly read out or not. Also, checking whether test data has been properly read out from the memory array can be conducted with a simple structure and in a short period of processing time.

According to another aspect of the present invention, a semiconductor memory device includes a first circuit provided for every bit line pair; and a control circuit sequentially rendering active a plurality of word lines to apply an output of the first circuit to one bit line of a bit line pair according to the arrangement of the word line rendered active to alter the potential of the bit line pair from a precharged voltage such that test data is written into a memory cell connected to the relevant word line that is rendered active by the potential of the altered bit line pair. Thus, test data can be written into the memory array with a simple structure and in a short period of processing time.

According to a further aspect of the present invention, a semiconductor memory device includes a first circuit provided corresponding to a bit line pair to output a predetermined logic state; a second circuit provided between the first circuit and one bit line of the bit line pair, formed of a switch that conducts in response to activation of a control signal; a first control circuit rendering the control signal active in response to a row active designation after activation of a sense amplifier, and rendering the control signal inactive when a predetermined external signal attains a predetermined logic value; and a second control circuit in response to a bit line pair read out designation to provide data outside the semiconductor memory device according to a potential of a relevant bit line pair amplified by the sense amplifier. Thus, a status in which the potential difference of paired bit lines is set small is intentionally produced to evaluate the performance of the sense amplifier with a simple structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 22A, 22B and 22C show the results of sense amplifiers A, B and C, respectively.

DESCRIPTION OF THE PREFERRED EMBODIMENTS

First Embodiment

Figure 1:
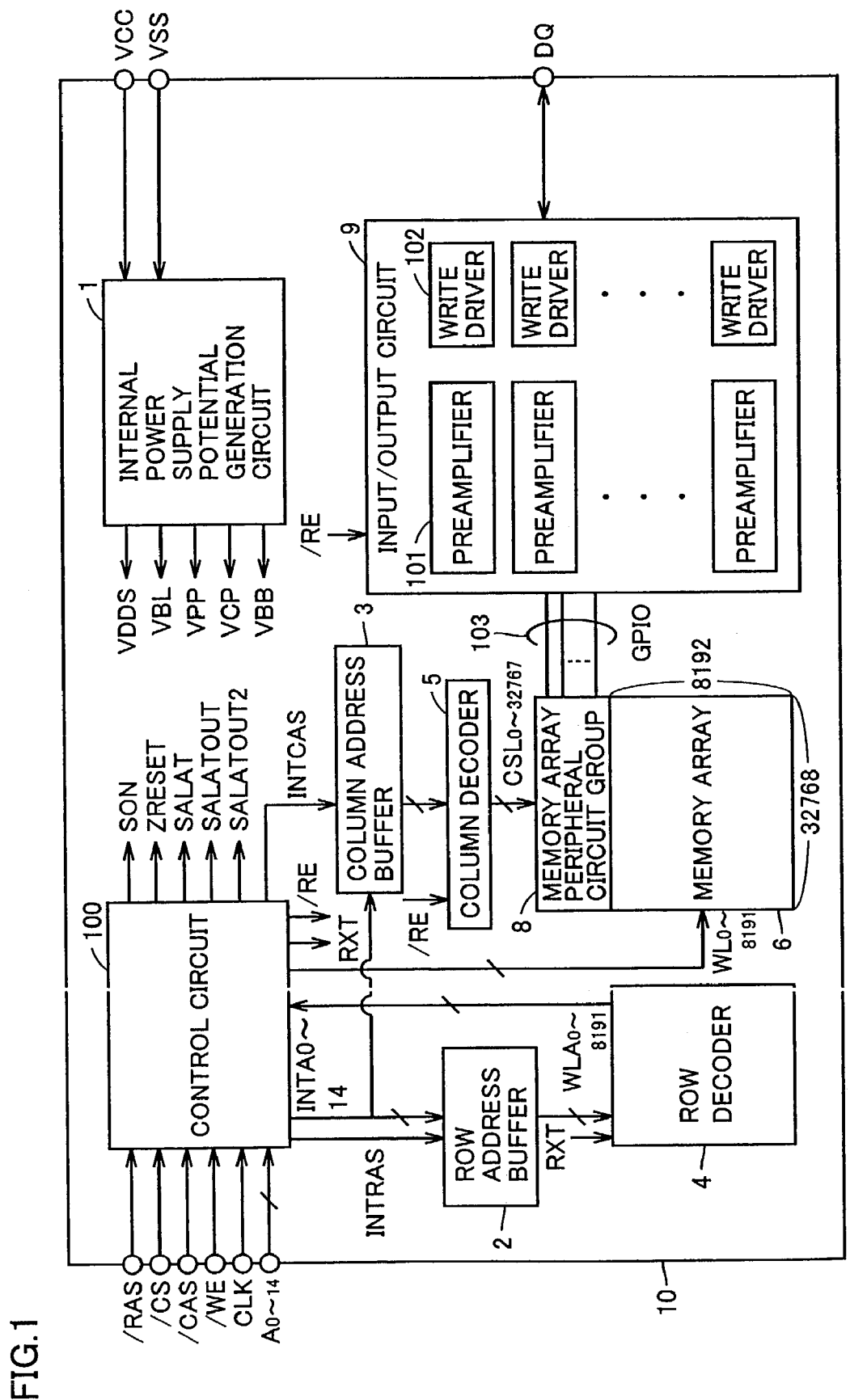
FIG. 1 shows an entire structure of a DRAM according to an embodiment of the present invention.

Referring to FIG. 1, a DRAM 10 according to a first embodiment of the present invention includes an internal power supply potential generation circuit 1, a row address buffer 2, a column address buffer 3, a row decoder 4, a column decoder 5, a memory array 6, a memory array peripheral circuit group 8, an input/output circuit 9, and a control circuit 100.

Internal power supply potential generation circuit 1 generates internal power supply potential VDDS, VBL, VPP, VCP, VBB and the like based on externally applied power supply potential VCC and ground potential VSS to supply the generated internal power supply potential to other elements in DRAM 10.

VDDS is supplied to a control circuit, a sense amplifier, or the like as an operating power supply voltage, and is generated by down-converting external power supply voltage VCC. VBL is a bit line precharge voltage supplied to an equalizer. The value of VBL is ½ VDDS. VPP is a voltage generated by a charge pump operation, used to boost word line WL as well as a control signal (SAMBTOUT) that will be described afterwards. The value of VPP is higher than that of operating power supply voltage VDDS. VCP is a cell plate voltage applied to the cell plate of a capacitor in a memory cell. The value of VCP is equal to VSS (ground voltage). VBB is a negative voltage generated by a charge pump operation, and is applied to a substrate region or the like in a memory cell array.

Memory array 6 is formed of a plurality of memory cells MC, each storing data of 1 bit. Each memory cell is specified by a row address and a column address. It is assumed that memory array 6 of the present embodiment has the so-called half pitch cell arrangement structure.

Figure 2:
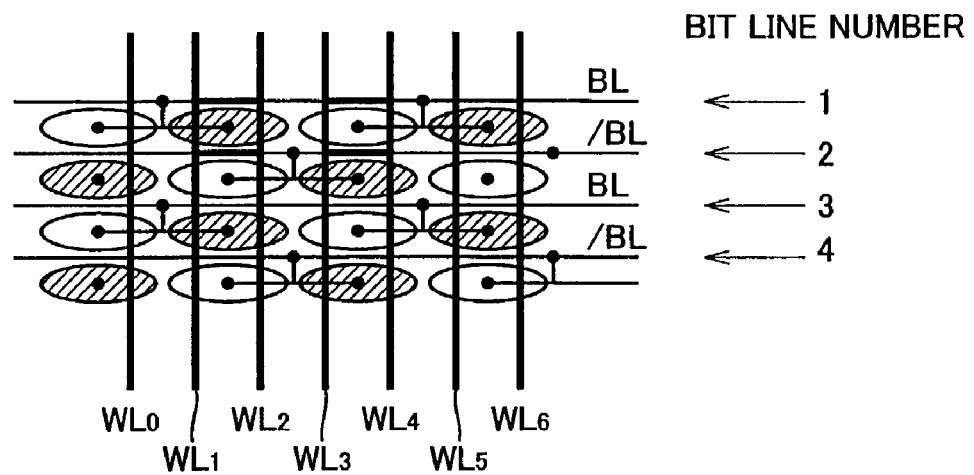
FIG. 2 shows a structure of a half pitch cell arrangement of a memory array.

Referring to the half pitch cell arrangement of the memory array in FIG. 2, a pair of memory cells MCP is arranged periodically at a crossing of two word lines WL and one bit line BL or /BL. Specifically, an odd numbered bit line BL and an even numbered bit line /BL that are adjacent to each other form a bit line pair BL and /BL. A memory cell pair MCP is arranged at the crossing of an odd numbered bit line BL and the 4m-th and (4m+1)th word lines WL. Also, a memory cell pair MCP is arranged at the crossing between an even numbered bit line /BL and the (4m+2)th and (4m+3)th word lines WL.

In a test mode, writing and reading are conducted based on a memory array data pattern in which adjacent memory cells store values differing from each other as shown in FIG. 2. This stored pattern of data in memory cells is called "cell checker".

Figure 3:
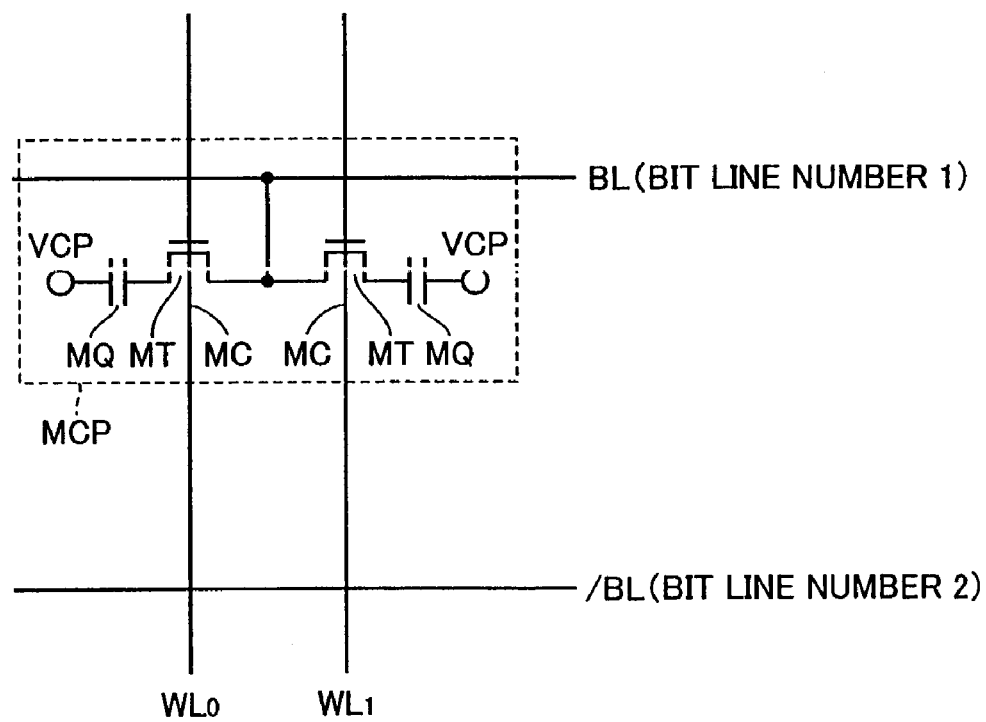
FIG. 3 shows a structure of a Memory Cell Pair (MCP).

Referring to FIG. 3, a memory cell pair MCP includes a capacitor MQ to store information, and an N channel MOS transistor MT for access. In a reading mode, word line WL attains a selected level of H, whereby access transistor MT conducts. In response, the potential of bit line BL is increased or decreased by a small amount $\Delta Vs$ depending upon the charge stored in capacitor MC. In the case where charge corresponding to an L level is stored (charge=0), the potential of bit line BL is VBL−$\Delta Vs$. In the case where charge of an H level is stored (charge Q=Cs×VDDS), the potential of bit line BL is VBL+$\Delta Vs$. Here, Cs is the capacitance of capacitor MQ, and Cb is the capacitance of a bit line. $\Delta Vs$=VBL/(1+Cb/Cs) is established. The value of $\Delta s$ is approximately 0.2V when, for example, VBL=2.5V.

In a write mode, word line WL attains the selected level of H, whereby access transistor MT conducts. In response, charge corresponding to the potential of bit line BL is stored in capacitor MQ. In the case where the potential of bit line BL is at an H level, charge of an H level (charge Q=Cs× VDDS) is stored. In the case where the potential of bit line BL is at an L level, charge corresponding to an L level is stored (charge=0).

Row address buffer 2 inputs internal address signals INTA0–14 when internal signal INTRAS attains an L level. Column address buffer 3 inputs internal address signals INTA0–14 when internal signal INTZCAS attains an L level.

Row decoder 4 responds to activation of a row active signal RXT to input internal address signals INTA0–12 from row address buffer 2 to pull up a row address signal line WLAi (i=0–8191) to an H level according to the logic state of 13 bits. Row address signal line WLAi (i=0–8191) is connected to control circuit 100.

Column decoder 5 responds to activation of read operation designation signal /RE or a write operation designation signal /WR accept internal address signals INTA0–14 from column address buffer 3. Column decoder 5 pulls up the potential of column select line CSLj (j=0–32767) to the select level of H according to the logic state of the 15 bits of internal address signals INTA0–14.

Figure 4:
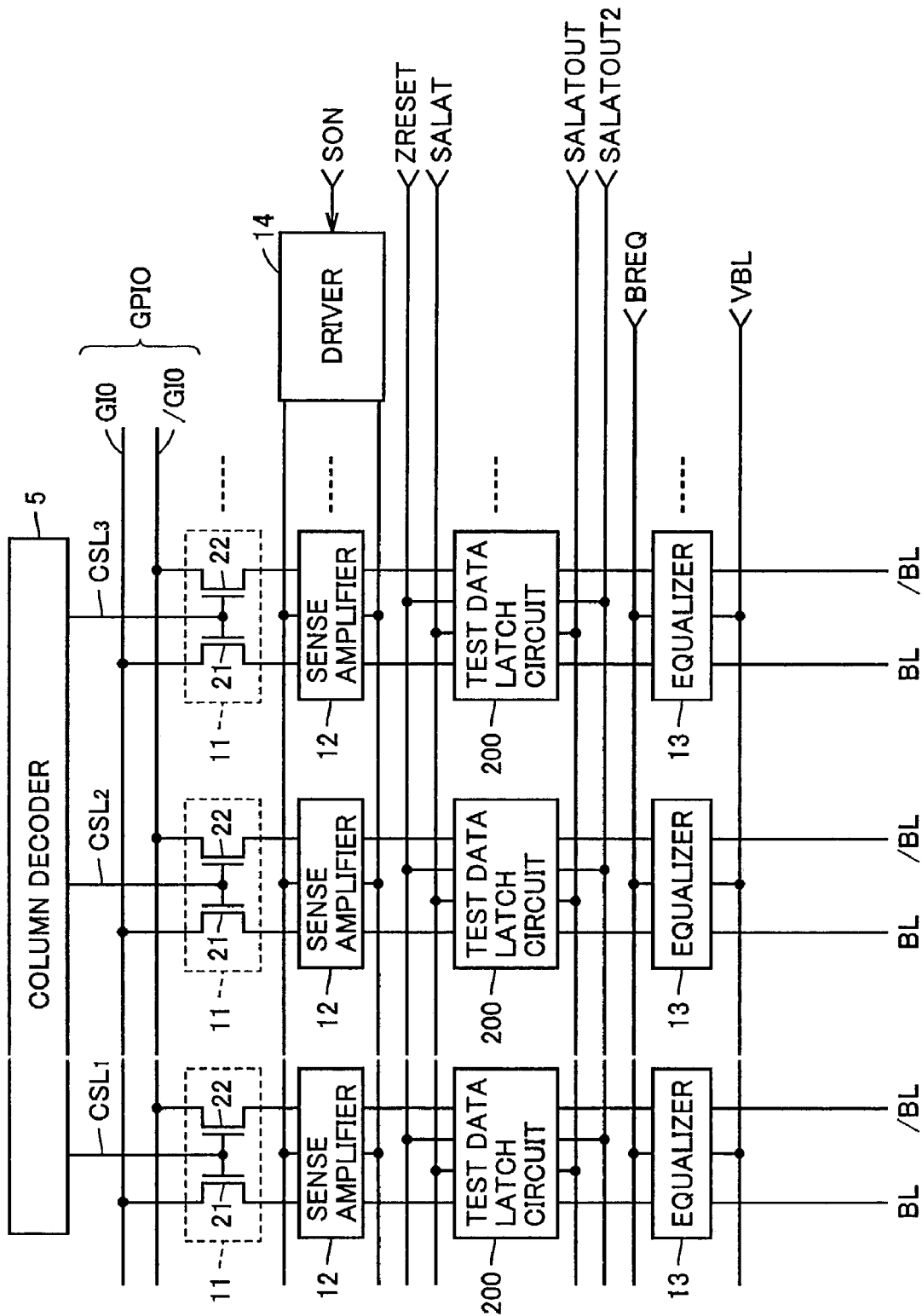
FIG. 4 is a block diagram of a structure of a memory array peripheral circuit group of FIG. 1.
Figure 5:
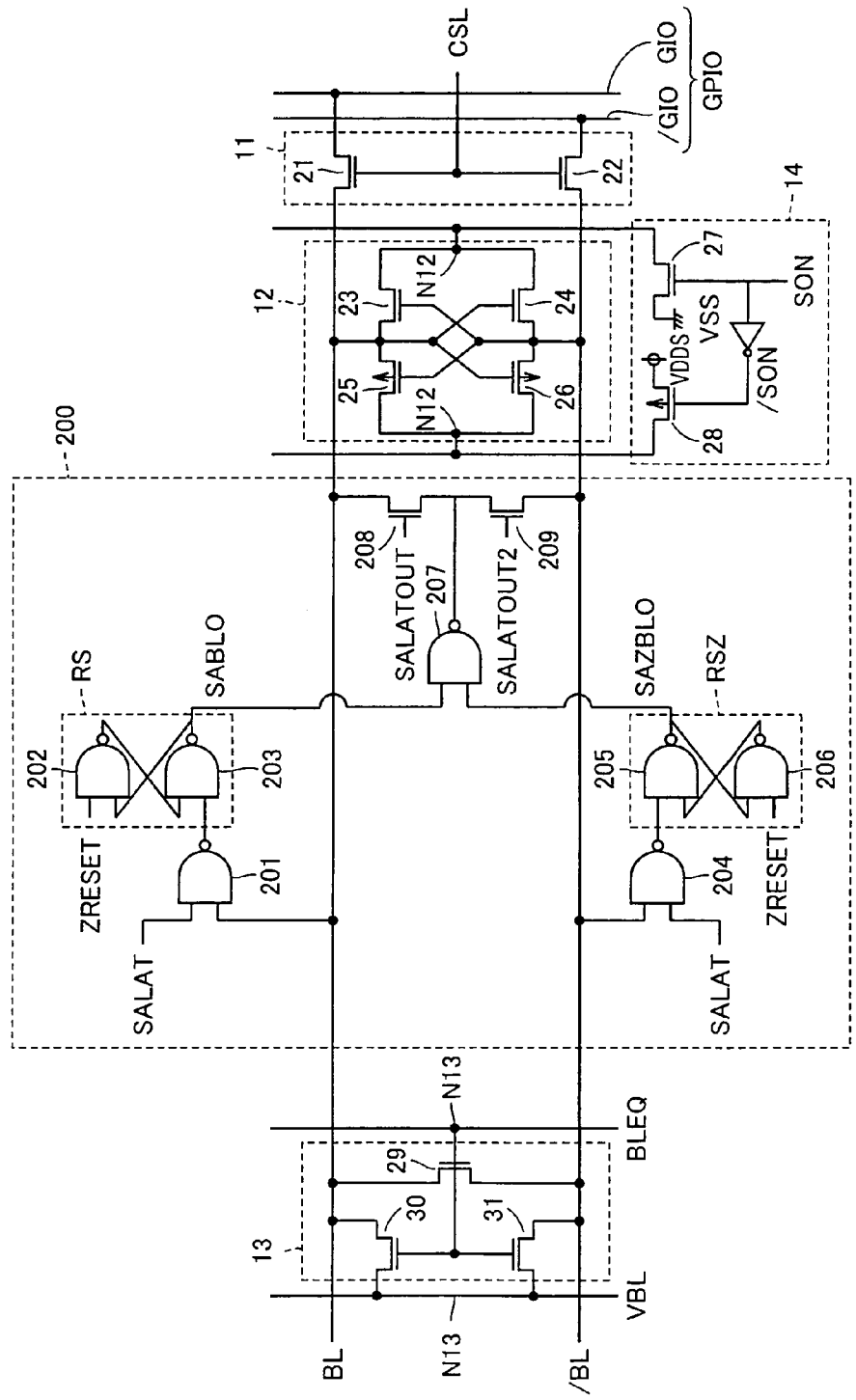
FIG. 5 is a circuit diagram showing in detail a structure of one column.

Memory array peripheral circuit group 8 shown in FIGS. 4 and 5 includes a driver 14, a data input/output line pair GIOP (GIO and /GIO), a column select line CSL corresponding to each column, a column select gate 11, a sense amplifier 12, and an equalizer 13.

Sense amplifier 12 includes an N channel MOS transistor 23 connected between a bit line BL and a node N12, an N channel MOS transistor 24 connected between a bit line /BL and node N12, a P channel MOS transistor 25 connected between bit line BL and a node N12', and a P channel MOS transistor 26 connected between bit line /BL and node N12'. Driver 14 includes an N channel MOS transistor 27 connected between node N12 and the line of ground potential VSS, and a P channel MOS transistor 28 connected between node N12' and the line of internal power supply potential VDDS. N channel MOS transistor 23 and P channel MOS transistor 25 both have their gates connected to bit line /BL. N channel MOS transistor 24 and P channel MOS transistor 26 both have their gates connected to bit line BL. N channel MOS transistor 27 and P channel MOS transistor 28 receive sense amplifier activation signals SON and /SON, respectively, at their gates.

In response to sense amplifier activation signals SON and /SON attaining an H level and an L level, respectively, N channel MOS transistors 27 and 28 conduct, whereby node N12 attains the level of ground potential VSS and node N12' attains the level of internal power supply potential VDDS. When the potential of bit line BL is higher than the potential of bit line /BL by a slight amount ΔV, sense amplifier 12 functions to pull up the potential of bit line BL to VDDS (H level) and pull down the potential of bit line /BL to VSS (L level). In contrast, when the potential of bit line /BL is higher than the potential of bit line BL by a small amount ΔV, the potential of bit line is pulled down to VSS (L level) and the potential of bit line /BL is pulled up to VDDS (H level).

Equalizer 13 includes an N channel MOS transistor 29 connected between bit lines BL and /BL, an N channel MOS transistor 30 connected between bit line BL and a node N13', and an N channel MOS transistor 31 connected between bit line /BL and node N13'. All the gates of N channel MOS transistors 29–31 are connected to a node N13.

Node N13 receives a bit line equalize signal BLEQ whereas node N13' receives a precharged potential VBL (=VDDS/2). Equalizer 13 responds to bit line equalize signal BLEQ attaining an H level of activation to equalize the potentials of bit lines BL and /BL to the level of precharge potential VBL. Bit line equalize signal BLEQ attains an H level in a PRE mode and an L level in an ACT mode.

Column select gate 11 includes N channel MOS transistors 21 and 22 provided between bit line pair BL and /BL and data input/output line pair GIO and /GIO. The gates of N channel MOS transistors 21 and 22 are connected to column decoder 5 via column select line CSL. N channel MOS transistors 21 and 22 of column select gate 11 connected to the column select line selected by column decoder 5 are rendered conductive, whereby bit line pair BL and /BL connected to that column select gate is connected with data input/output line pair GPIO (GIO and /GIO).

Test data latch circuit 200 includes a NAND circuit 201 and an RS flip-flop RS corresponding to bit line BL. NAND circuit 201 has one input terminal connected to bit line BL and the other input terminal receiving a control signal SALAT. RS flip-flop RS is formed of NAND circuits 202 and 203. RS flip-flop RS has its set input terminal connected to the output terminal of NAND circuit 201 and its reset input terminal receiving a control signal ZRESET.

Test data latch circuit 200 includes a NAND circuit 204 and a RS flip-flop RSZ corresponding to bit line /BL. NAND circuit 204 has one input terminal connected to bit line /BL and the other input terminal receiving control signal SALAT. RS flip-flop RSZ is formed of NAND circuits 205 and 206. RS flip-flop RSZ has its set input terminal connected to the output terminal of NAND circuit 204 and its reset input terminal receiving control signal ZRESET.

The logic values of the outputs SABLO and SAZBLO of RS flip-flops RS and RSZ in a test data reading operation will be described here.

First, RS flip-flops RS and RSZ are reset. Specifically, a control signal ZRESET of an L level (one shot pulse) is input, and RS flip-flops RS and RSZ output SABLO=L and SAZBLO=H.

Then, RS flip-flops RS and RSZ are applied with logic values corresponding to the potentials of bit lines BL and /BL every time a word line is rendered active.

Specifically, in the case of BL=H and /BL=L, input of control signal SALAT=H (one shot pulse) causes NAND circuit 201 to provide an L output and NAND circuit 204 to provide an H output. In response, RS flip-flop RS outputs SABLO=H whereas RS flip-flop RSZ outputs SAZBLO=L. Even if the activated word line changes, SABLO=H and SAZBLO=L are sustained as long as BL=H and /BL=L. However, SABLO=H and SAZBLO=H are output once BL=L and /BL=H are established.

In the case where BL=L and /BL=H, an input of control signal SALAT of an H level (one shot pulse) causes NAND circuit 201 to provide an H output and NAND circuit 204 to provide an L output. In response, RS flip-flop RS outputs SABLO=L and RS flip-flop RSZ outputs SAZBLO=H. Even if the activated word line changes, SABLO=L and SAZBLO=H are sustained as long as bit line BL=L and /BL=H. However, SABLO=H and SAZBLO=H are output once BL=H and /BL=L are established.

Therefore, even if the activated word line is switched in a test data reading operation, SABLO=L and SAZBLO=H, or SABLO=H and SAZBLO=L are output when the potentials of paired bit lines BL and /BL are always equal. When there is a change in the potentials of paired bit lines BL and /BL according to switching of the activated word line, SABLO=H and SAZBLO=H are output.

The logic values of outputs SABLO and SAZBLO of RS flip-flops RS and RSZ in a test data writing operation will be described hereinafter.

First, RS flip-flops RS and RSZ are reset. Specifically, control signal ZRESET of an L level (one shot pulse) is input, whereby RS flip-flops RS and RSZ output SABLO=L and SAZBLO=L.

Test data latch circuit 200 includes a NAND circuit 207. NAND circuit 207 has one input terminal receiving SABLO and the other input terminal receiving SAZBLO. NAND circuit 207 provides an L output only when SABLO=H and SAZBLO=H (namely, when the potentials of bit lines BL and /BL once change in a test data read out operation), and otherwise an H output.

Test data latch circuit 200 includes an N channel MOS transistor 208 and an N channel MOS transistor 209.

The gate of N channel MOS transistor 208 is applied with a control signal SALATOUT in a test data reading operation and writing operation. N channel MOS transistor 208 is rendered conductive when control signal SALATOUT attains an H level to provide the output of NAND circuit 207 onto bit line BL.

In the case where NAND circuit 207 provides an H output, the potential of bit line BL is increased by $\Delta V$ when at VBL in response to SALATOUT=H. When this potential difference $\Delta V$ is amplified by sense amplifier 12, bit lines BL and /BL attain an H level and an L level, respectively.

In the case where NAND circuit 207 provides an L output, the potential bit line BL, when at the level of VBL, is decreased by $\Delta V$ according to control signal SALATOUT of an H level. When this potential difference $\Delta V$ is amplified by sense amplifier 12, bit lines BL and /BL attain an L level and an H level, respectively.

The gate of N channel MOS transistor 209 is applied with a control signal SALATOUT2 in a test data writing operation. N channel MOS transistor 209 is rendered conductive when control signal SALATOUT2 attains an H level to provide the output of NAND circuit 207 onto bit line /BL.

In the case where NAND circuit 207 provides an H output, the potential of bit line /BL, when at the level of VBL, is increased by $\Delta V$ according to control signal SALATOUT2=H. When this potential difference $\Delta V$ is amplified by sense amplifier 12, bit lines BL and /BL attain an L level and an H level, respectively.

In the case where NAND circuit 207 provides an L output, the potential of bit line /BL, when at the level of VBL, is decreased by $\Delta V$ according to control signal SALATOUT2=H. When this potential difference $\Delta V$ is amplified by sense amplifier 12, bit lines BL and /BL attain an H level an L level, respectively.

Referring to FIG. 1 again, data input/output line pair GIOP is provided for every subarray that is a division of memory array 6 by a predetermined number of columns. Data input/output line GIOP couples bit line pair BL and /BL selected by column decoder 5 with input/output circuit 9.

Input/output circuit 9 includes a preamplifier 101 and a write driver 102, both provided corresponding to each data input/output line pair GPIO.

Write driver 102 is rendered active in response to write operation designation signal /WR during the mode of writing data from memory cell MC to provide the data transmitted through input/output terminal DQ to bit line pair BL and /BL connected to data input/output line pair GPIO.

Preamplifier 101 is rendered active in response to a read operation designation signal /RE in a mode of reading out data from memory cell MC to further amplify the data amplified by sense amplifier 12 corresponding to the bit line pair connected to data input/output line pair GPIO and provides the amplified data to input/output terminal DQ.

Figure 6:
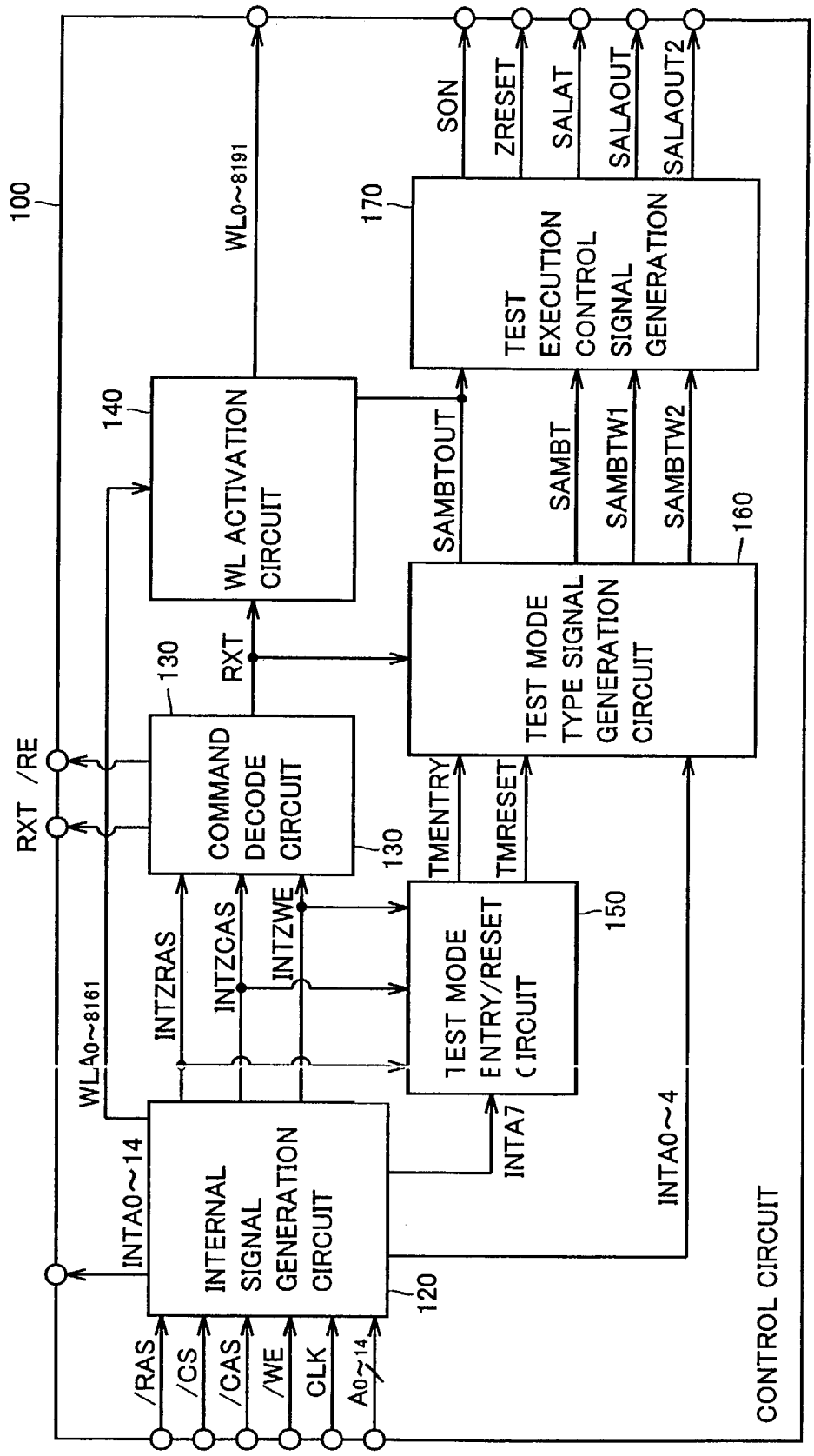
FIG. 6 shows a structure of a control circuit 100.

Control circuit 100 of FIG. 6 includes an internal signal generation circuit 120, a command decode circuit 130, a WL activation circuit 140, a test mode entry/reset circuit 150, a test mode type signal generation circuit 160, and a test execution control signal generation circuit 170.

Figure 7:
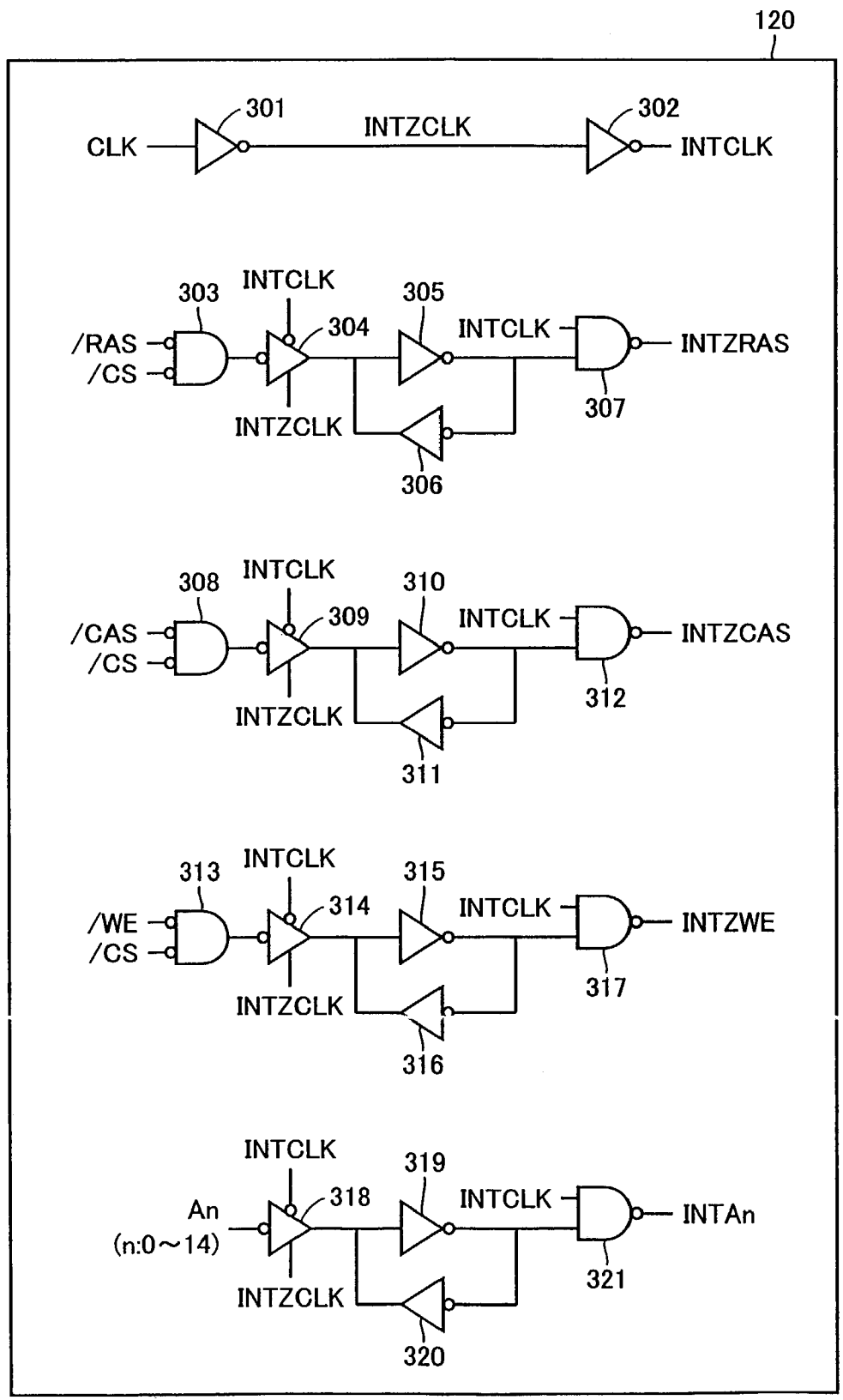
FIG. 7 shows in detail a structure of an internal signal generation circuit 120.

Internal signal generation circuit 120 of FIG. 7 receives externally applied a clock signal CLK, a row address strobe signal /RAS, a column address strobe signal /CAS, a write enable signal /WE, a chip select signal /CS, and address signals A0–14.

Internal signal INTCLK is generated by inverters 301 and 302 based on external clock signal CLK. Internal signal INTZRAS is generated by a clocked CMOS inverter 304, an inverter 305, an inverter 306, and a NAND circuit 307 based on external control signal /RAS, external control signal /CS and internal signal INTCLK. Internal signal INTZWE is generated by a clocked CMOS inverter 314, an inverter 315, an inverter 316 and a NAND circuit 317 based on external control signals /WE and /CS and internal signal INTCLK. Internal signal INTAn is generated by an inverter 319, an inverter 320 and a NAND circuit 321 based on an external address signal An.

Figure 8:
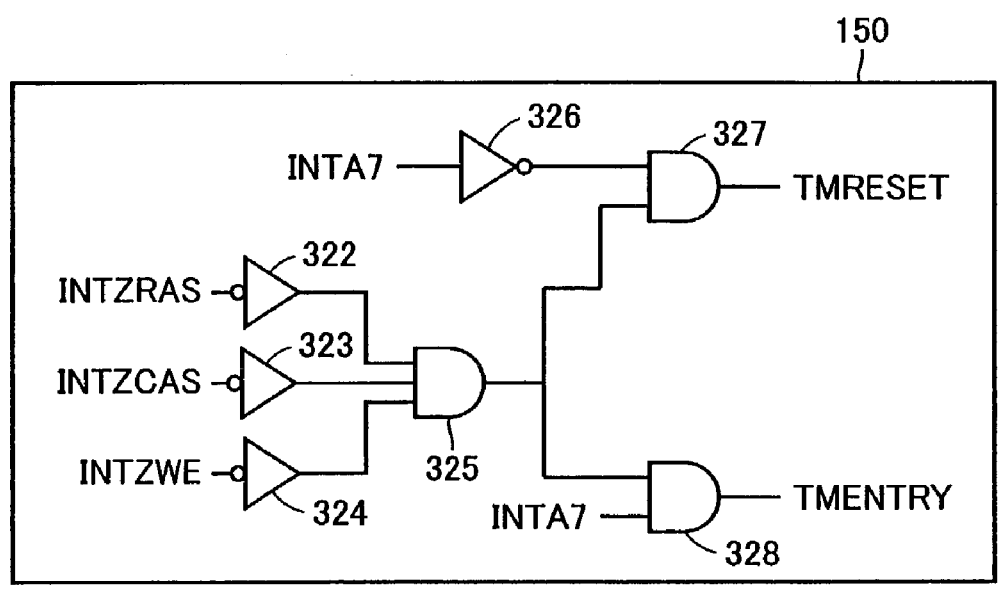
FIG. 8 shows in detail a structure of a test mode entry/reset circuit 150.

Test mode entry/reset circuit 150 of FIG. 8 includes inverters 322, 323, 324, an AND circuit 325, an inverter 326, and AND circuits 325, 327 and 328. When INTZRAS=L, INTZCAS=L, INTZWE=L and INTA7=H, test mode entry/reset circuit 150 provides TMENTRY of an H level of activation. When INTZRAS=L, INTZCAS=L, INTZWE=L and INTA7=L, test mode entry/reset circuit 150 provides TMREST of an H level of activation.

Figure 9:
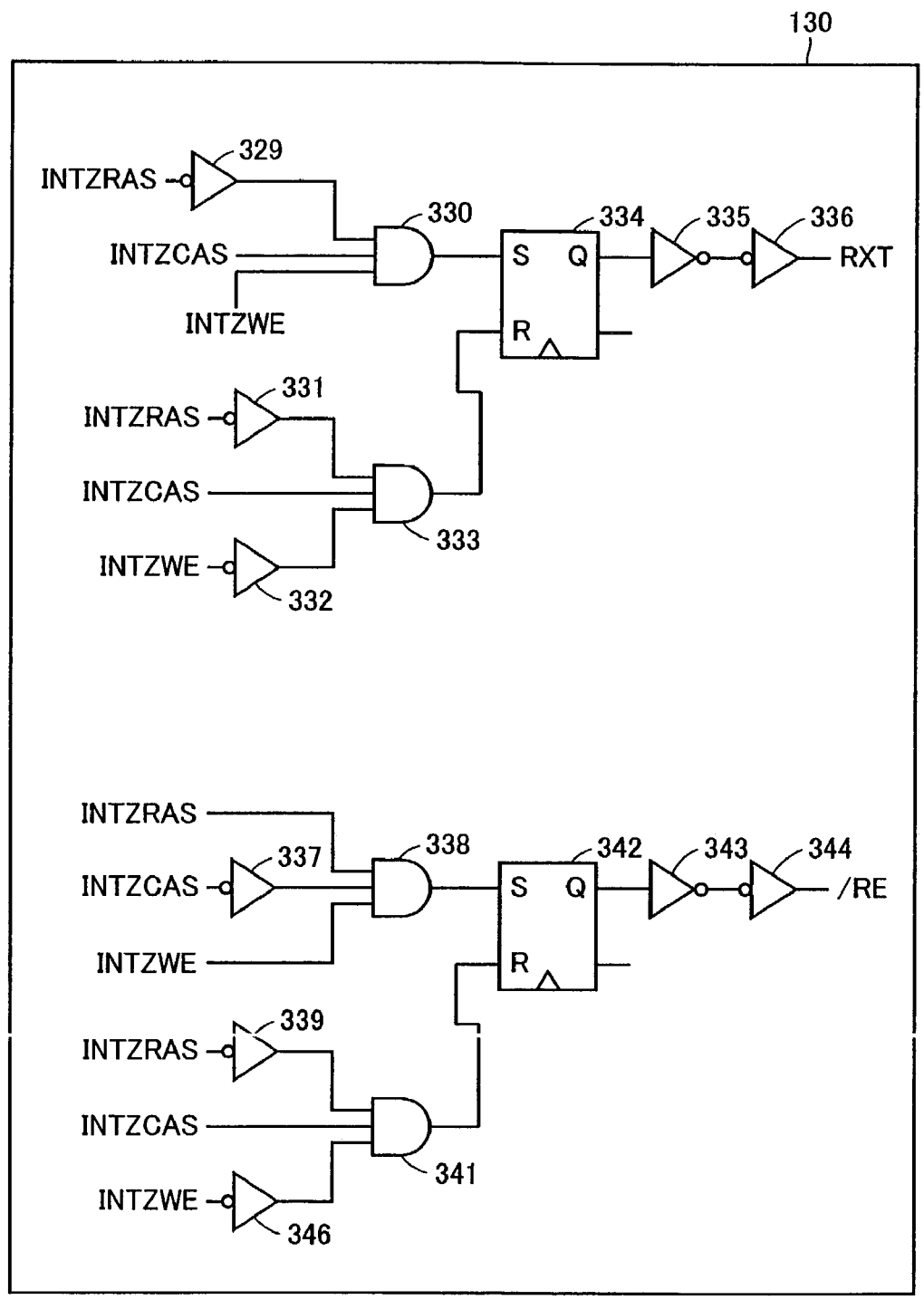
FIG. 9 shows in detail a structure of a command decode circuit 130.

In command decode circuit 130 of FIG. 9, the level of row active signal RXT designating a selected state of a row is under control of inverter 329, AND circuit 330, inverters 331, 332, AND circuit 333, RS flip-flop 334, and inverters 335 and 336 according to signals INTZRAS, INTZCAS and INTZWE.

When INTZRAS=L, INTZCAS=H and INTZWE=H, RXT maintains an H level of activation. When INTZRAS=L, INTZCAS=H, and INTZWE=L, RXT maintains an L level of inactivation.

The level of read operation designation signal /RE designating data read out is under control of inverter 337, AND circuit 338, inverters 339 and 340, AND circuit 341, RS flip-flop 342, inverters 343 and 344 according to INTZRAS, INTZCAS, and INTZWE.

When INTZRAS=H, INTZCAS=L and INTZWE=H, /RE maintains an H level of activation. When INTZRAS=L, INTZCAS=H and INTZWE=L, /RE maintains an L level of inactivation.

Although not illustrated, write operation designation signal /WR designating data writing is rendered active and inactive according to the levels of INTZRAS, INTZCAS, and INTZWE.

Figure 10:
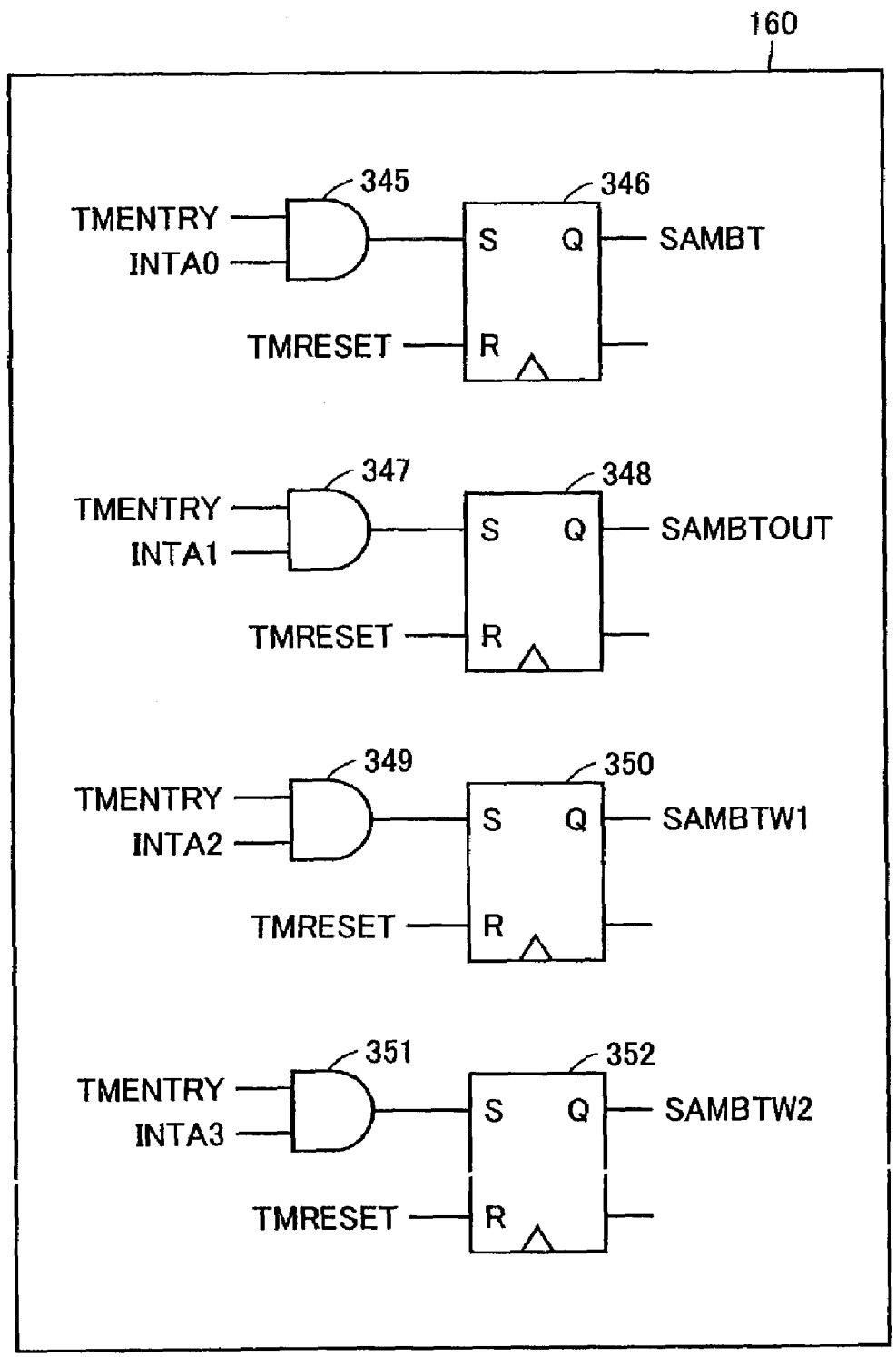
FIG. 10 shows in detail a structure of a test mode type signal generation circuit 160.

In test mode type signal generation circuit 160 of FIG. 10, the level of SAMBT is under control by inverter 345 and RS flip-flop 346 according to TMENTRY, INTA0, and TMRESET. When TMENTRY=H, INTA0=H and TMRESET=L, SAMBT is maintained at an H level (activation level). When TMENTRY=L, INTA0=L and TMRESET=H, SAMBT maintains an L level (inactivation level). SAMBT=H indicates that a SAMBT test mode is entered whereas SAMBT=L indicates that a SAMBT test mode is not entered.

The level of SAMBTOUT is under control of inverter 347 and RS flip-flop 348 according to TMENTRY, INTAL and TMRESET. When TMENTRY=H, INTA1=H, and TMRESET=L, SAMBTOUT is maintained at an H level (activation level). When TMENTRY=L, INTAL=L and TMRESET=H, SAMBTOUT is maintained at an L level (inactivation level). SAMBTOUT=H indicates that a SAMBTOUT test mode is entered whereas SAMBTOUT=L indicates that a SAMBTOUT test mode is not entered.

The level of SAMBTW1 is under control of inverter 349 and RS flip-flop 350 according to TMENTRY, INTA2 and TMRESET. When TMENTRY=H, INTA1=H and TMRESET=L, SAMBTW1 maintains an H level (activation level). When TMENTRY=L, INTA2=L and TMRESET=H, SAMBTW1 maintains an L level (inactivation level). SAMBTW1=H indicates that a SAMBTW1 test mode is entered whereas SAMBTW1=L indicates that a SAMBTW1 test mode is not entered.

The level of SAMBTW2 is under control of inverter 351 and RS flip-flop 352 according to TMENTRY, INTA3, TMRESET. When TMENTRY=H, INTA3=H and TMRESET=L, SAMBTW2 maintains an H level (activation level). When TMENTRY=H, INTA3=L and TMRESET=L, SAMBTW2 maintains an L level (inactivation level). SAMBT2=H indicates that a SAMBTW2 test mode is entered whereas SAMBTW2=L indicates that a SAMBTW2 test mode is not entered.

Figure 11:
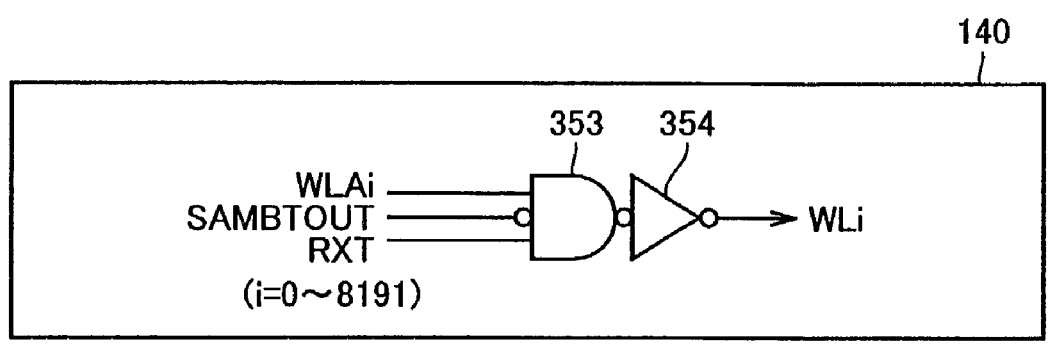
FIG. 11 shows a structure of a WL activation circuit 140.

WL activation circuit 140 of FIG. 11 has a row address signal line WLAi (i=0–8191) and a word line WLi (i=0–8191) connected, and is supplied with a boosted voltage VPP. WL activation circuit 140 includes a NAND circuit 353 and an inverter 354.

When RXT=H, WLAi=H and SAMBTOUT=L, WL activation circuit 140 functions to pull up word line WLi to an H level of activation (boosted voltage VPP). When RXT=L, word line WLi is rendered inactive.

When a SAMBTOUT mode is entered, the word line is not rendered active since SAMBTOUT=H.

Figure 12:
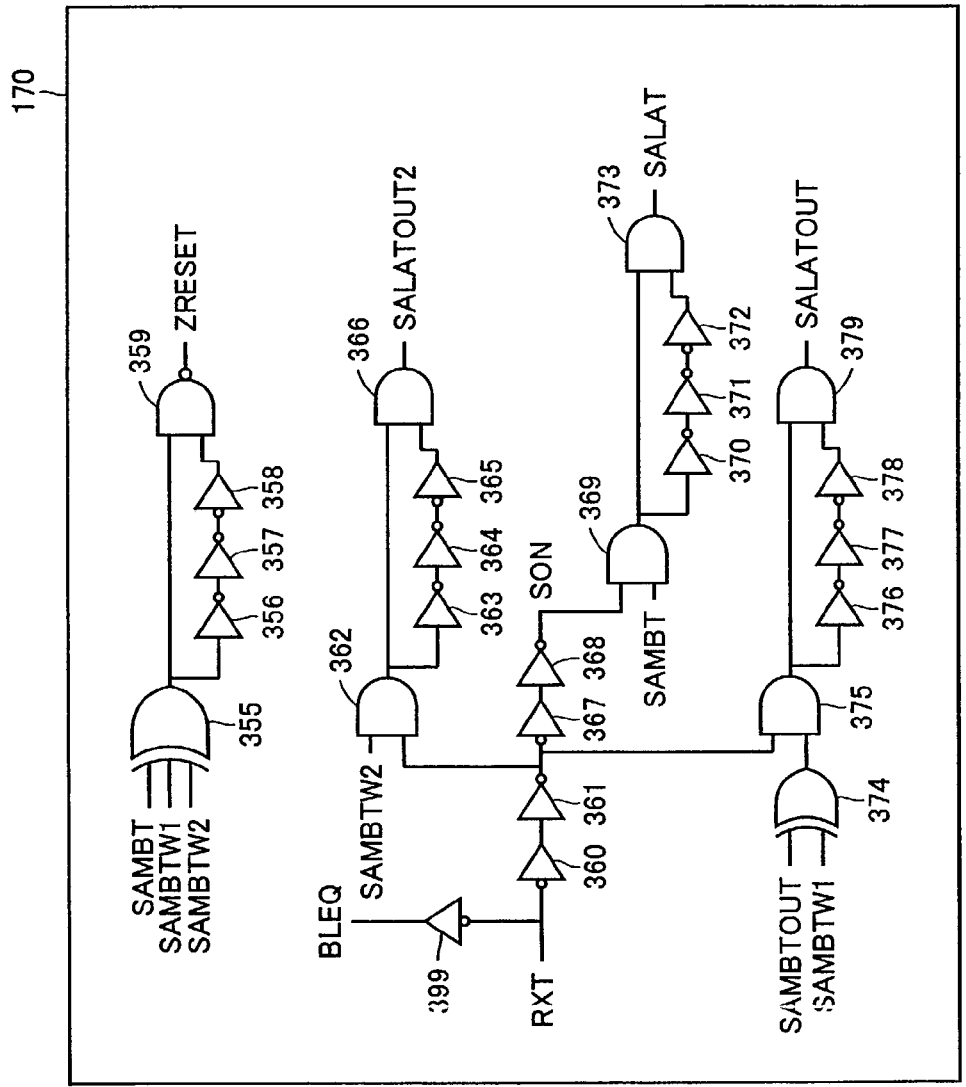
FIG. 12 shows in detail a structure of a test execution control signal generation circuit 170.

In test execution control signal generation circuit 170 of FIG. 12, the level of ZRESET is under control of an ExOR circuit 355, inverters 356, 357 and 358, and NAND circuit 359 according to SAMBT, SAMBTW1 and SAMBTW2. When any of SAMBT, SAMBTW1 and SAMBTW2 is rendered active of an H level, ZRESET is provided as a one shot pulse of "L" (inactivation level) in synchronization with the activation.

SALATOUT2 is under control of inverters 360 and 361, AND circuit 362, inverters 363, 364, 365, and AND circuit 366 according to RXT and SAMBTW2. When RXT is rendered active of an H level under the state of SAMBTW2=H, SALATOUT2 is output as a one shot pulse of "H" (activation level) lagging behind that activation. Sense amplifier activation signal SON also corresponds to a one shot pulse of "H" (activation level) lagging behind the activation of RXT=H. Sense amplifier activation signal SON attains an H level later than SALATOUT2 attaining an H level according to the number of connected circuit elements. Since SALATOUT2 serves to render N channel MOS transistor 209 conductive to provide the output of NAND circuit 207 to bit line /BL, a high voltage level is desirable so that N channel MOS transistor 209 is rendered conductive deeply. Therefore SALATOUT2 is rendered active by boosted voltage VPP employed when a word line is rendered active.

SALAT is under control of inverters 360, 361, 367 and 368, AND circuit 369, inverters 370, 371, 372, and AND circuit 373 according to RXT and SAMBT. When RXT is rendered active of an H level under the state of SAMBT=H, SALAT is output as a one shot pulse of "H" (activation level) lagging behind that activation. Sense amplifier activation signal SON is also output as a one shot pulse of "H" (activation level) lagging behind the activation of RXT=H. Sense amplifier activation signal SON attains an H level earlier than SALATOUT=H according to the number of connected circuit elements. Similar to SALATOUT2, this SALATOUT is rendered active by boosted voltage VPP employed when a word line is rendered active so that N channel MOS transistor 208 deeply conducts.

SALATOUT is under control of inverters 360 and 361, ExOR circuit 374, AND circuit 375 inverters 376, 377, 378, and AND circuit 379 according to RXT, SAMBTOUT and SAMBTW1. When RXT attains an H level of activation under the state of SAMBTW1=H or SAMBTOUT=H, SALATOUT is output as a one shot pulse of "H" (activation level) lagging behind the activation. Sense amplifier activation signal SON is also output as a one shot pulse "H" (activation level) lagging behind the activation of RXT=H. Sense amplifier activation signal SON attains an H level later than SALATOUT attaining an H level according to the number of connected circuit elements.

When RXT attains an H level and an L level, bit line equalize signal BLEQ attains an L level (inactivation level) and an H level (activation level), respectively.

Test Pattern Read Out Operation

Figure 13:
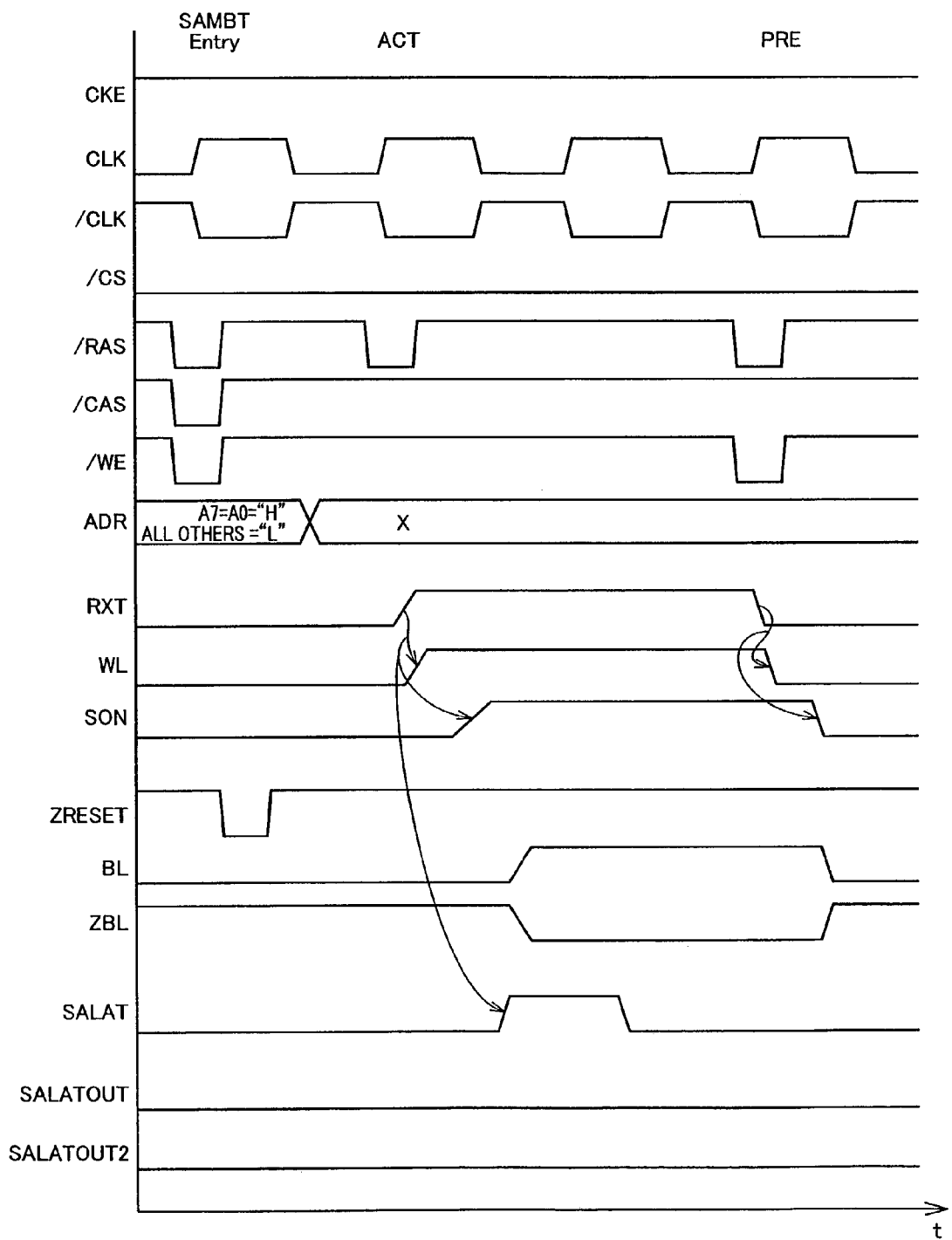
FIGS. 13 and 14 are timing charts of a test pattern read out operation.
Figure 14:
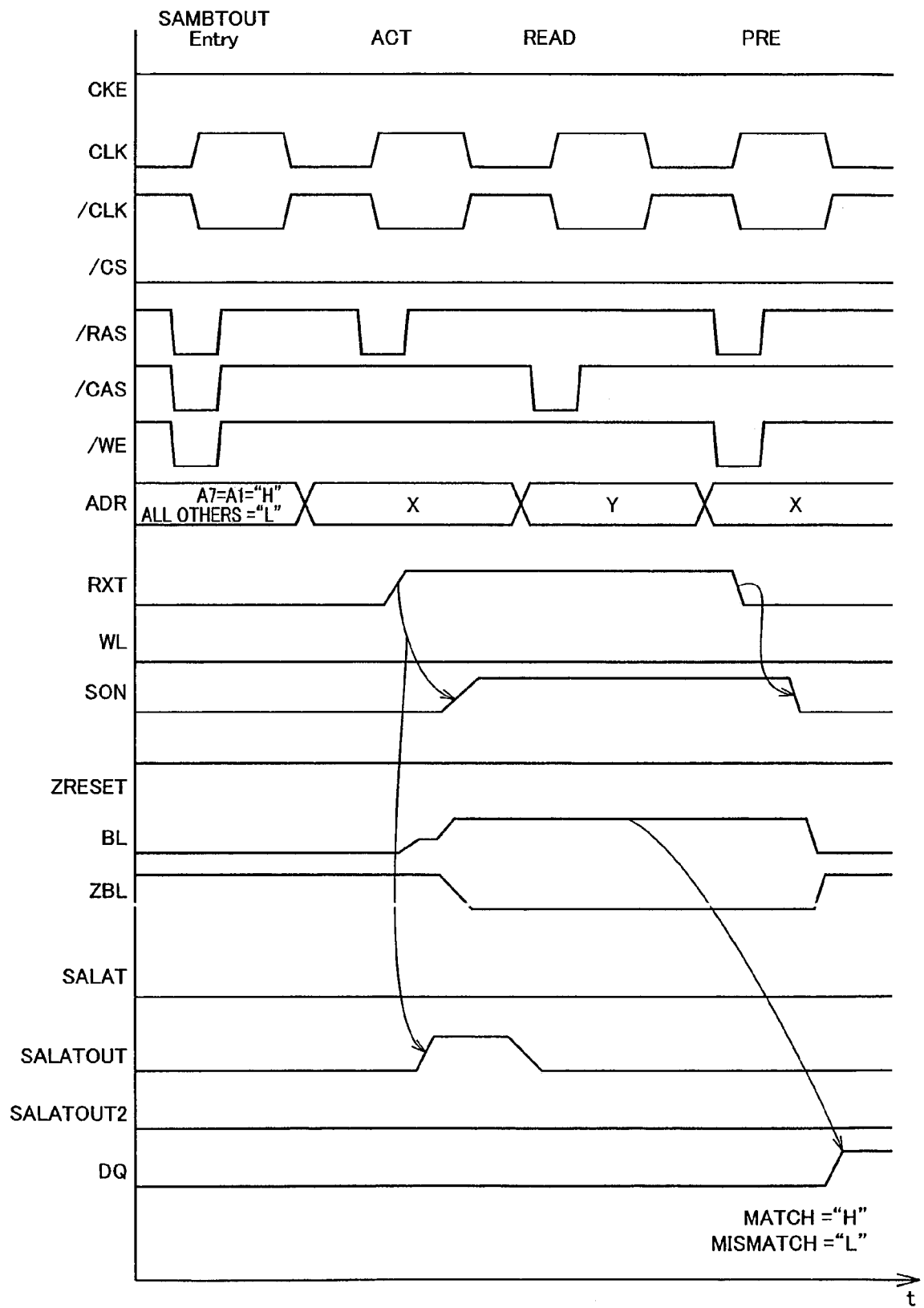

A test pattern read out operation to test whether the test pattern in the memory array is properly read out or not will be described with reference to the timing charts of FIGS. 13 and 14.

(1) SAMBT Mode

Internal signal generation circuit 120 responds to externally applied /RAS=L, /CAS=L, /WE=L, A0=H and A7=H to output INTZRAS=L, INTZCAS=L, INTZWE=L, INTA0=H and INTA7=H.

Test mode entry/reset circuit 150 outputs INTZRAS=L, INTZCAS=L, INTZWE=L, INTA7=H; and TMENTRY=H.

Test mode type signal generation circuit 160 latches SAMBT=H according to INTA0=H and TMENTRY=H. Test execution control signal generation circuit 170 outputs ZRESET=L (one shot pulse) by SAMBT=H.

RS flip-flop RS latches SAMBLO=L by ZRESET=L. RS flip-flop RSZ latches SAZBLO=L by ZRESET=L.

(2) ACT Mode

Internal signal generation circuit 120 responds to externally applied RAS=L, /CAS=H and /WE to output INTZRAS=L, INTZCAS=H and INTZWE=H.

Command decode circuit 130 responds to INTZRAS=L, INTZCAS=H and INTZWE=H to latch row active signal RXT=H.

Test execution control signal generation circuit 170 responds to a row active signal RXT of an H level to pull down bit line equalize signal BLEQ to an L level. In response, equalizer 13 is rendered inactive. Under this state, the potentials of bit lines BL and /BL attain a floating state at VBL (=VDDS/2).

When addresses A0–14 are input, internal signal generation circuit 120 outputs INTA0–14. Row decoder 4 responds to row active signal RXT of an H level to accept internal address signals INTA0–12 from row address buffer 2. Row address signal line WLAi (i=4m+1 or 4m+2 (m is an integer of at least 0), and $0 \leq i < 8192$) is pulled up to an H level according to the logic states of the 13 bits.

WL activation circuit 140 pulls up word line WLi to an H level when the signal of row address signal line WLAi (i=4m+1, or 4m+2 (m is an integer of at least 0), and $0 \leq i < 8192$) is at an H level and row active signal RXT is at an H level.

Accordingly, access transistor MT of the memory cell connected to word line WLi is rendered conductive, and storage node SN of memory capacitor MQ is coupled to the corresponding bit line. Therefore, the charge stored in capacitor MQ of this memory cell is read out onto the bit line.

At the current stage, memory cell MC connected to word line WLi (i=4m+1 (m is an integer of at least 0) and 0≦i<8192) stores charge corresponding to an H level, and is connected to bit line BL. Therefore, the potential of bit line BL will be altered to result in BL=VBL+ΔV. Bit line /BL remains at the level of VBL.

Memory cell MC connected to word line WLi (i=4m+2 (m is an integer of at least 0) and 0≦i<8192) stores data of an L level, and is connected to bit line /BL. Therefore, the potential of bit line /BL changes to result in /BL=VBL−ΔV. Bit line BL remains at the level of VBL.

Test execution control signal generation circuit 170 responds to row active signal RXT at an H level to pull up sense amplifier activation signal SON to an H level. Sense amplifier 12 amplifies the potential difference between bit lines BL and /BL by a sense amplifier activation signal SON of an H level. As a result, bit lines BL and /BL attain an H level and an L level, respectively.

After sense amplifier activation signal SON goes high, test execution control signal generation circuit 170 pulls SALAT to an H level (one shot pulse) by row active signal RXT=H and SAMBT=H.

RS flip-flop RS responds to SALAT=H and BL=H to latch SABLO=L. RS flip-flop RSZ responds to SALAT=H and /BL=L to latch SAZBLO=H.

(3) PRE Mode

Internal signal generation circuit 120 responds to externally applied /RAS=L, /CAS=H and /WE=L to output INTZRAS=L, INTZCAS=H and INTZWE=L.

Command decode circuit 130 responds to INTRZRAS=L, INTZCAS=H, and INTZWE=L to latch row active signal RXT of an L level. WL activation circuit 140 responds to row active signal RXT at an L level to pull down word line WLi to an L level.

Test execution control signal generation circuit 170 responds to row active signal RXT at an L level to pull up bit line equalize signal BLEQ to an H level. In response, equalizer 13 is rendered active. As a result, the potentials of bit lines BL and /BL attain a fixed state of VBL (=VDDS/2).

Test execution control signal generation circuit 170 responds to row active signal RXT at an L level to pull down sense amplifier activation signal SON to an L level.

(4) The above processes of (2) and (3) are repeated 4096 times with the value of i of word line WLi (i=4m+1 or 4m+2 (m is an integer of at least 0), and 0≦i<8192) altered.

When the data can be properly read out from the memory cells by activation of WL, SABLO=L and SAZBLO=H are output. In contrast, in the case where data could not be properly read out from any of the memory cells, SABLO=H SAZBLO=H are output.

(5) SAMBTOUT Mode

Internal signal generation circuit 120 responds to externally applied /RAS=L, /CAS=L, /WE=L, A1=H and A7=H to output INTRZRARS=L, INTZCAS=L, INTZWE=L, INTA1=H and INTA7=H.

Test mode entry/reset circuit 150 responds to INTRZRAS=L, INTZCAS=L, INTZWE=L and INTA7=H to output TMENTRY=H.

Test mode type signal generation circuit 160 responds to INTAL=H and TMENTRY=H to latch SAMBTOUT=H.

(6) ACT Mode

Internal signal generation circuit 120 responds to externally applied /RAS=L, /CAS=H and /WE=H to output INTRZRAS=L, INTZCAS=H and INTZWE=H.

Command decode circuit 130 responds to INTRZRAS=L, INTZCAS=H and INTZWE=H to output row active signal RXT of an H level. WL activation circuit 140 does not pull up word line WLi to an H level by SAMBTOUT=H.

Test execution control signal generation circuit 170 responds to row active signal RXT of an H level to pull up sense amplifier activation signal SON to an H level. Test execution control signal generation circuit 170 outputs SALATOUT of an H level (one shot pulse) before sense amplifier activation signal SON goes high by row active signal RXT=H and SAMBTOUT=H.

Thus, when SABLO=L and SAZBLO=H are constantly latched (i.e., when memory cell data is properly read out), bit line BL attains the level of VDDS/2+ΔV by SALATOUT=H. In response to sense amplifier activation signal SON of an H level, sense amplifier 12 conducts amplification, whereby bit lines BL and /BL attain an H level and an L level, respectively.

In the case where SABLO=H and SAZBLO=H are latched, (i.e., when data could not be properly read out from any of the memory cells), bit line BL attains the level of VDDS/2−ΔV by SALATOUT=H. In response to sense amplifier activation signal SON=H, sense amplifier 12 conducts amplification, whereby bit lines BL and /BL attain an L level and an H level, respectively.

(7) READ Mode

Internal signal generation circuit 120 responds to externally applied /RAS=H, /CAS=H and /WE=H to output INTZRAS=H, INTZCAS=L, and INTZWE=H.

Command decode circuit 13 responds to INTZRAS=H, INTZCAS=L and INTZWE=H to output a read operation designation signal /RE of an H level.

In response, column decoder 5 accepts internal address signals INTA0–14 from column address buffer 3. Column decoder 5 pulls up the potential of column select line CSLj (j=0–32767) to a selective level of H according to the logic states of the 15 bits of internal address signals INTA0–14. Accordingly, N channel MOS transistors 21 and 22 of column select gate 11 connected to that column select line CSLj are rendered conductive, whereby bit line pair BL and /BL connected to that column select gate are coupled with data input/output line pair GPIO (GIO and /GIO).

In response to /RE of an H level, preamplifier 101 is rendered active, whereby a logic value of H or L is provided to input/output terminal DQ. When bit lines BL and /BL attain an H level and an L level, respectively, (i.e., when data are properly read out from the memory cells), the logic value to input/output terminal DQ is at an H level. When bit lines BL and /BL are at an L level and an H level, respectively, (i.e., when data could not be properly read out from any of the memory cells) the logic value provided to input/output terminal DQ is at an L level.

(8) PRE Mode

Internal signal generation circuit 120 responds to externally applied /RAS=L, /CAS=H, and /WE=L to output INTZRAS=L, INTZCAS=H, and INTZWE=L.

Command decode circuit 130 responds to INTZRAS=L, INTZCAS=H and INTZWE=L to latch row active signal RXT=L.

Test execution control signal generation circuit 170 responds to row active signal RXT of an L level to pull up bit line equalize signal BLEQ to an H level. In response, equalizer 13 is rendered active, whereby the potentials of bit lines BL and /BL are at the fixed state of VBL (=VDDS/2).

Test execution control signal generation circuit 170 responds to row active signal RXT at an L level to pull down sense amplifier activation signal SON to an L level.

(9) The above processes of (7) and (8) are repeated 32768 times with the value of j of column select line CSLj (j=0–32767) altered.

(10) The above processes of (1)–(9) are repeated 4096 times with WLi(i=4m+1, or i=4m+2 (m is an integer of at least 0) and 0≦i<8192) altered to WLi (i=4m, or i=4m+3 (m is an integer of at least 0), and 0≦i<8192).

In this case, the memory cell connected to word line WLi ((i=4m (m is an integer of at least 0), and 0≦i<8192) stores data of an L level, and is connected to bit line BL. Therefore, bit line BL is at the level of VDDS/2−ΔV whereas bit line BL remains at the level of VDDS/2. Upon amplification by sense amplifier 12, bit lines BL and /BL attain an L level and the H level, respectively.

The memory cell connected to word line WLi (i=4m+3 (m is an integer of at least 0), 0≦i<8192) stores data of an H level, and is connected to bit line /BL. Therefore, bit line remains at the level of VDDS/2 whereas bit line /BL attains the level of VDDS/2+ΔV. Upon amplification by sense amplifier 12, bit lines BL and /BL attain an L level and an H level, respectively.

In the case where data can be read out properly from the memory cells by activation of WL, SABLO=H and SAZBLO=L are output. In the case where data could not be properly read out from any of the memory cells, SABLO=H and SAZBLO=H are output.

Thus, in the case of WLi (i=4m or i=4m+3 (m is an integer of at least 0), 0≦i<8192), the logic value provided to input/output terminal DQ is at an H level when data could be properly read out from the memory cell, and at an L level when data could not be properly read out from any of the memory cells.

The time required for the above modes will be compared with T1 as the test data read out time of the present embodiment, T2 as the test data read out time in the unit of a general memory cell, and T3 as the test data read out time in a multibit test.

T1=2×{SAMBT entry time+4096×(ACT mode time+PRE mode time)+SAMBTOUT entry time+32768×(ACT mode time+READ mode time+PRE mode time)}≈8192×(ACT mode time+PRE made time)+32768×(ACT mode time+READ mode time+PRE mode time) is established. Since ACT mode time+PRE mode time is approximately 50 ns and ACT mode time+READ mode time+PRE mode time is approximately 100 ns, T1≈8192×50 ns+32768×100 ns=3,686,400 ns.

In contrast, T2=8192×32768×(ACT mode time+READ mode time+PRE mode time) is established. Since ACT mode time+READ mode time+PRE mode time is approximately 100 ns, T2≈8192×32768×100 ns=26,843,545,600 ns.

In a multibit test, T3≈8192×32768×100/128 ns=209,715,200 ns is established when the number q of subarray is 128.

Therefore, T1 is 1/7281 of T2, and 1/56 of T3.

Test Pattern Write Operation

Figure 15:
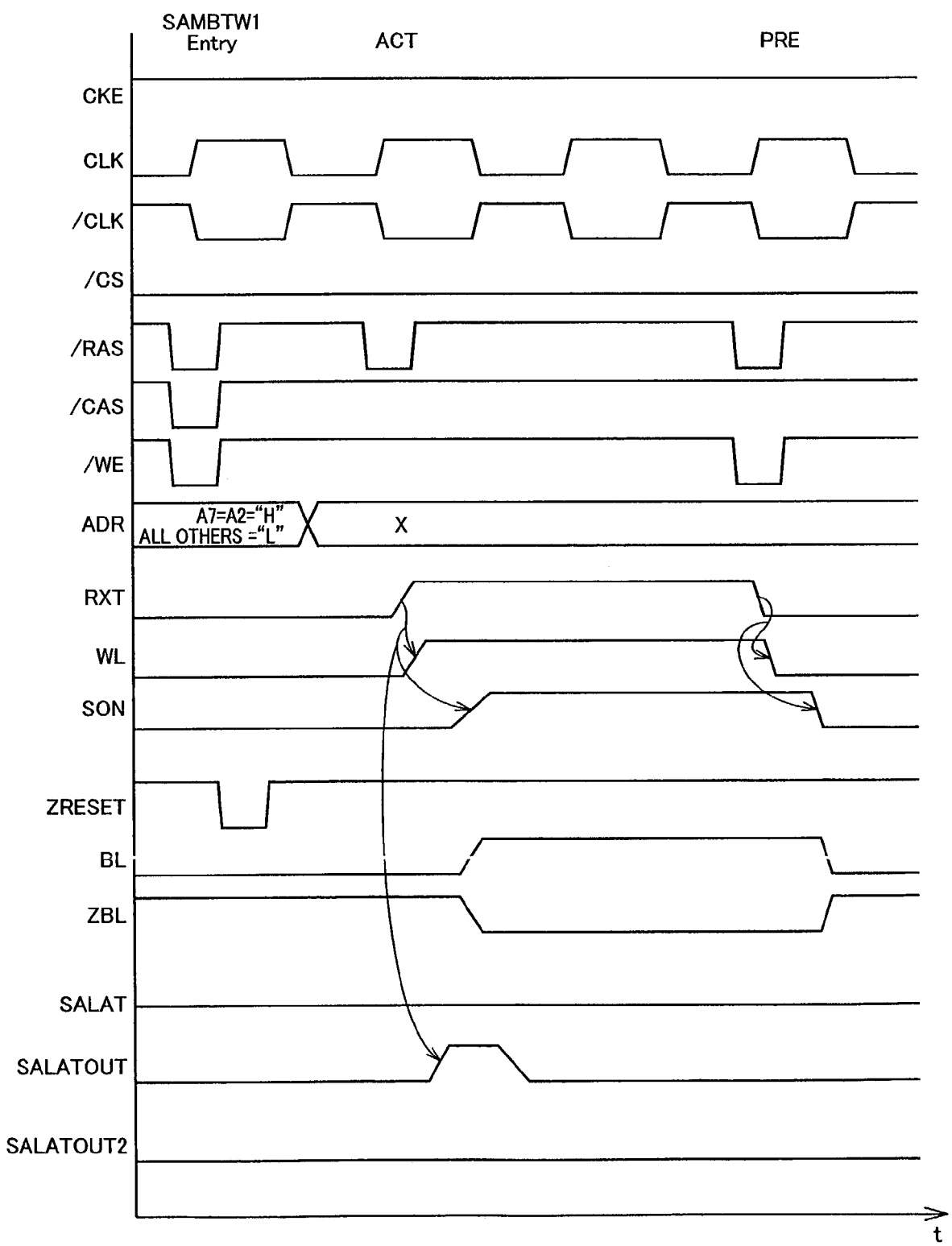
FIGS. 15 and 16 are timing charts of a test pattern write operation.
Figure 16:
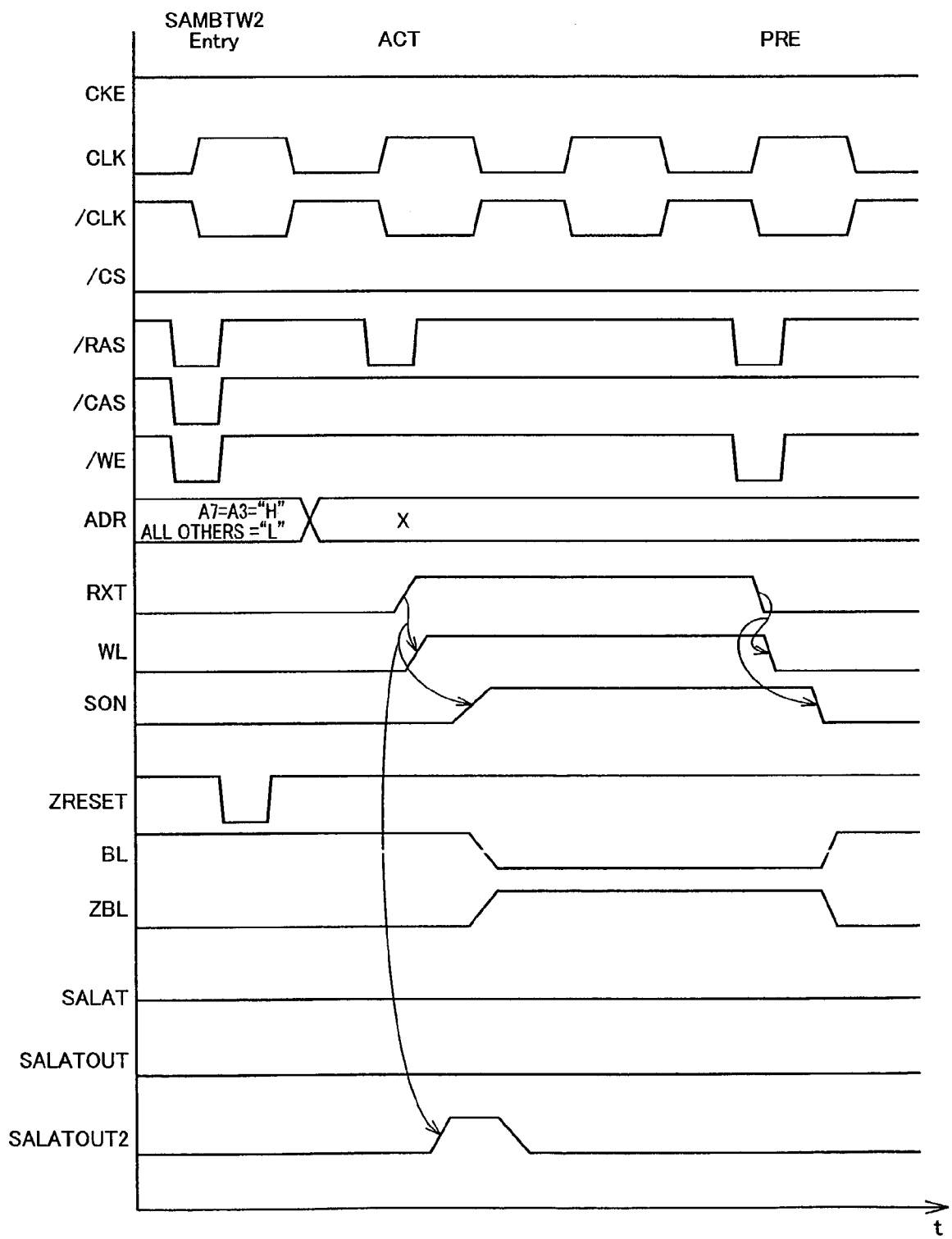

A test pattern write operation will be described hereinafter with reference to the timing charts of FIGS. 15 and 16.

(1) SAMBTW1 Mode

Internal signal generation circuit 120 responds to externally applied /RAS=L, /CAS=L, /WE=L, A2=H, and A7=H to output INTZRAS=L, INTZCAS=L, INTZWE=L, INTA2=H, and INTA7=H.

Test mode entry/reset circuit 150 responds to INTZRAS=L, INTZCAS=L, INTZWE=L, and INTA 7=H to output TMENTRY of an H level.

Test mode type signal generation circuit 160 responds to INTA2=H and TMENTRY=H to latch SAMBTW1=H. Test execution control signal generation circuit 170 responds to SAMBTW1=H to output ZRESET of an L level (one shot pulse).

In response, RS flip-flop RS latches SABLO=L. RS flip-flop RSZ responds to ZRESET=L to latch SAZBLO=L. Accordingly, NAND circuit 207 provides an H output.

(2) ACT Mode

Internal signal generation circuit 120 responds to externally applied /RAS=L, /CAS=H, and /WE=H to output INTZRAS=L, INTZCAS=H, INTZWE=H.

Command decode circuit 130 responds to INTZRAS=L, INTZCAS=H, and INTZWE=H to latch row active signal RXT of an H level.

Test execution control signal generation circuit 170 responds to row active signal RXT of an H level to pull down bit line equalize signal BLEQ to an L level. In response, equalizer 13 is rendered inactive. In this state, the potentials of bit lines BL and /BL attain a floating state at the level of VBL (=VDDS/2). Internal signal generation circuit 120 responds to externally applied address signals A0–14 to output INTA0–14.

Row decoder 4 responds to row active signal RXT of an H level to accept internal address signals INTA0–12 from row address buffer 2. According to the logic states of the 13 bits, row address signal line WLAi (i=4m+1 or 4m+2 (m is an integer of at least 0), and 0≦i<8192) is pulled up to an H level.

WL activation circuit 140 pulls up word line WLi to an H level according to the signal of row address signal line WLAi from row decoder 4 at an H level and row active signal RXT of an H level. Test execution control signal generation circuit 170 responds to row active signal RXT of an H level to pull up sense amplifier activation signal SON to an H level.

Test execution control signal generation circuit 170 pulls up SALATOUT to an H level (one shot pulse) according to row active signal RXT=H and SAMBTW1=H prior to sense amplifier activation signal SON going high.

In response to SALATOUT=H, N channel MOS transistor 208 of test data latch circuit 200 is rendered conductive, whereby an H level output of NAND circuit 207 is provided to bit line BL. Bit line BL attains the level of VDDS/2+ΔV.

Test execution control signal generation circuit 170 responds to row active signal RXT of an H level to pull up sense amplifier activation signal SON to an H level. Sense amplifier 12 responds to sense amplifier activation signal SON of an H level to amplify the potential difference of bit lines BL and /BL. As a result, bit lines BL and /BL attain an H level and an L level, respectively.

Accordingly, the memory cell connected to word line WLi (i=4m+1) has data of an H level written whereas the memory cell connected to word line WLi (i=4m+2) has data of an L level written.

(3) PRE Mode

Internal signal generation circuit 120 responds to externally applied /RAS=L, /CAS=H, and AWE=L to output INTZRAS=L, INTZCAS=H, and INTZWE=L.

Command decode circuit 130 responds to INTZRAS=L, INTZCAS=H, and INTZWE=L to latch row active signal RXT at an L level. WL activation circuit 140 responds to row active signal RXT of an L level to pull down word line WLi to an L level.

Test execution control signal generation circuit 170 responds to row active signal RXT of an L level to pull up bit line equalize signal BLEQ to an H level. In response, equalizer 13 is rendered active, whereby the potentials of bit lines BL and /BL attain the fixed state of VBL (=VDDS/2).

Test execution control signal generation circuit 170 responds to row active signal RXT of an L level to pull down sense amplifier activation signal SON to an L level.

(4) The processes of the above (2) and (3) are repeated 4096 times with the value of i of word line WLi (i=4m+1 or 4m+2 (m is an integer of at least 0), and 0≦i<8192) altered.

(5) SAMBTW2 Mode

Internal signal generation circuit 120 responds to externally applied /RAS=L, /CAS=L, /WE=L, A3=H and A7=H to output INTZRAS=L, INTZCAS=L, INTZWE=L, INTA3=H and INTA7=H.

Test mode entry/reset circuit 150 responds to INTZRAS=L, INTZCAS=L, INTZWE=L and INTA7=H to output TMENTRY=H.

Test mode type signal generation circuit 160 responds to INTA3=H, and TMENTRY=H to latch SAMBTW2=H.

Test execution control signal generation circuit 170 responds to SAMBTW2=H to output ZRESET of an L level (one shot pulse).

RS flip-flop RS responds to ZRESET of an L level to latch SABLO=L. RS flip-flop RSZ responds to ZRESET of an L level to latch SAZBLO=L. As a result, NAND circuit 207 provides an output of an H level.

(6) ACT Mode

Internal signal generation circuit 120 responds to externally applied /RAS=L, /CAS=H and /WE=H to output INTZRAS=L, INTZCAS=H, and INTZWE=H.

Command decode circuit 130 responds to INTZRAS=L, INTZCAS=H, and INTZWE=H to latch row active signal RXT of an H level.

Test execution control signal generation circuit 170 responds to row active signal RXT of an H level to pull down bit line equalize signal BLEQ to an L level. In response, equalizer 13 is rendered inactive. In this state, the potentials of bit lines BL and /BL attain a floating state at the level of VBL (=VDDS/2). Internal signal generation circuit 120 provides INTA0–14 when externally applied A0–14 are received.

Row decoder 4 responds to row active signal RXT of an H level to accept internal address signals INTA0–12 from row address buffer 2. According to the logic state of the 13 bits, row address signal line WLAi (i=4m or 4m+3 (m is an integer of at least 0), and 0≦i<8192) is pulled up to an H level.

Word line activation circuit 140 pulls word line WLi to an H level according to the signal of row address signal line WLAi from row decoder 4 and row active signal RXT at an H level.

Test execution control signal generation circuit 170 responds to row active signal RXT of an H level to pull up sense amplifier activation signal SON to an H level.

Test execution control signal generation circuit 170 responds to row active signal RXT=H and SAMBTW2=H to pull up SALATOUT2 to an H level (one shot pulse) before sense amplifier activation signal SON goes high.

In response to SALATOUT2=H, N channel MOS transistor 209 of test data latch circuit 200 is rendered conductive, whereby the H level output of NAND circuit 207 is provided to bit line BL. Bit line /BL attains the level of VDDS/2+ΔV.

Test execution control signal generation circuit 170 responds to row active signal RXT of an H level to pull up sense amplifier activation signal SON to an H level. Sense amplifier 12 responds to sense amplifier activation signal SON of an H level to amplify the potential difference between bit lines BL and /BL. As a result, bit lines BL and /BL attain an H level and an L level, respectively.

Thus, L data is written into the memory cell connected to WLi (i=4m) whereas H data is written into the memory cell connected to WLi (i=4m+3).

(7) PRE Mode

Internal signal generation circuit 120 responds to externally applied /RAS=L, /CAS=H and /WE=L to output INTZRAS=L, INTZCAS=H, and INTZWE=L.

Command decode circuit 130 responds to INTZRAS=L, INTZCAS=H, and INTZWE=L to latch row active signal RXT of an L level. In response, WL activation circuit 140 pulls down word line WLi to an L level.

Test execution control signal generation circuit 170 responds to row active signal RXT of an L level to pull up bit line equalize signal BLEQ to an H level. In response, equalizer 13 is rendered active. Thus, the potentials of bit lines BL and /BL are fixed at the level of VBL (=VDDS/2).

Test execution control signal generation circuit 170 responds to row active signal RXT of an L level to pull down sense amplifier activation signal SON to an L level.

(8) The above processes of (2) and (3) are repeated 4096 times with i of WLi (i=4m or 4m+3 (m is an integer of at least 0), and 0≦i<8192) altered.

The time required for the above modes will be compared with T1 as the test data writing time of the present embodiment, T2 as the test data writing time in the unit of a general memory cell, and T3 as the test data writing time in a multibit test.

T1=SAMBTW1 entry time+4096×(ACT mode time+PRE mode time)+SAMBTW2 entry time+4096×(ACT mode time+PRE mode time)≈8192×(ACT mode time PRE mode time) is established. Since ACT mode time+PRE mode time is approximately 50 ns, T1≈8192×50 ns=409,600 ns.

In contrast, T2=8192×32768×(ACT mode time+WRITE mode time+PRE mode time). Since ACT mode time+WRITE mode time+PRE 26,843,545,600 ns is established.

In a multibit test, T3≈8192×32768×100/128 ns=209,715,200 ns is established when the number q of subarray is 128.

Therefore, T1 is 1/65536 of T2, and 1/512 of T3.

By test data latch circuit 200 provided for each bit line pair and a control circuit 100 of the semiconductor memory device of the present embodiment, test data can be written into the memory array with a simple structure and in a short processing time. Also, a check can be made whether the test data is properly read out from the memory array.

<Modification>

The present invention is not limited to the above-described embodiment, and may encompass the modifications set forth below.

(1) Although the semiconductor memory device of the present embodiment includes both a test data reading capability and a test data writing capability, the semiconductor memory device may include only the reading capability or the writing capability.

Figure 17:
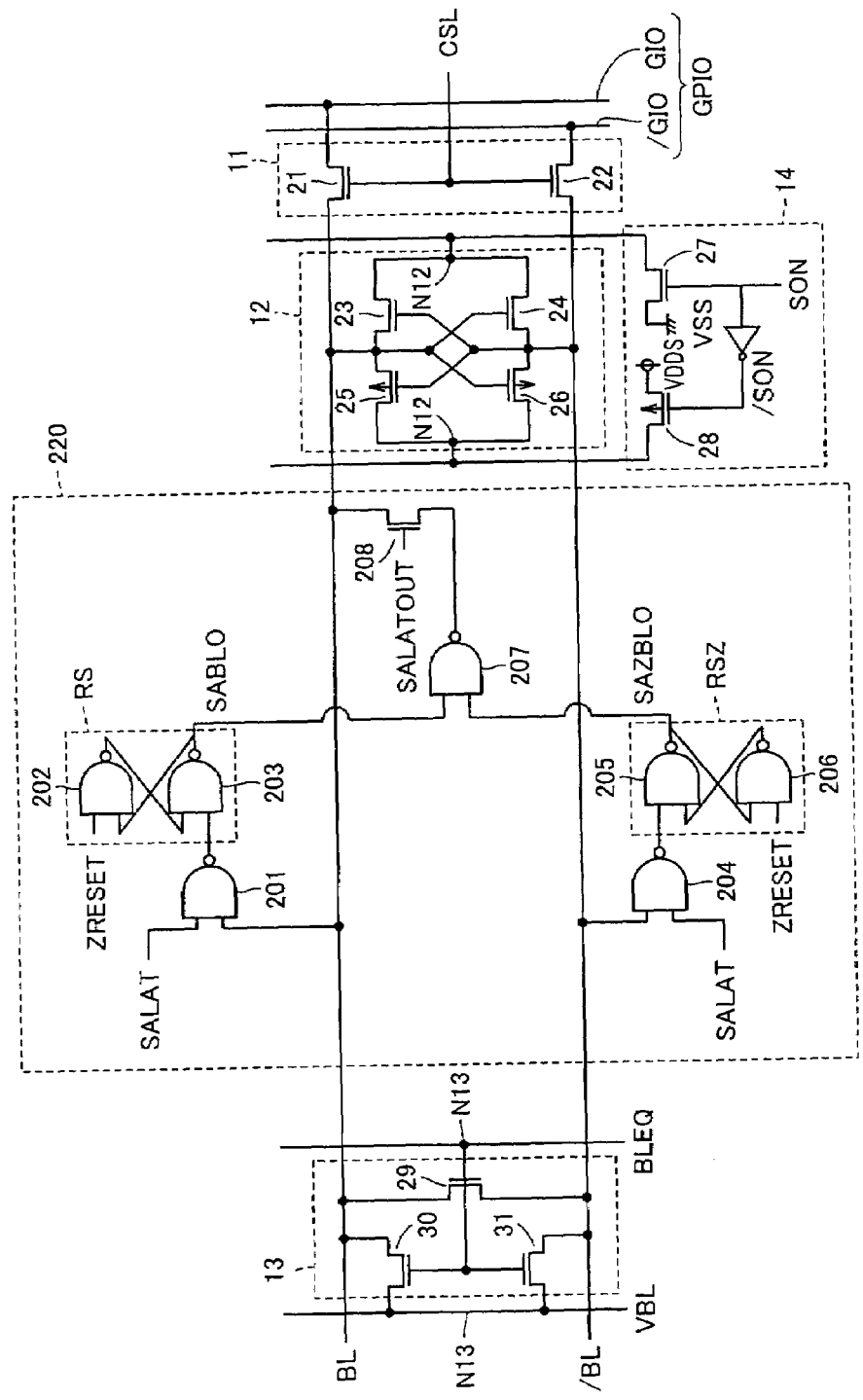
FIG. 17 shows another structure of a test data latch circuit.

In the case where only the reading capability is provided, the test data latch circuit can be implemented as shown in FIG. 17. According to the test data latch circuit of FIG. 17, the output of NAND circuit 207 is provided only to bit line BL in a test data reading mode. Therefore, test data latch circuit 220 includes only N channel MOS transistor 208, and does not include N channel MOS transistor 209.

In the case where only a reading capability is provided, N channel MOS transistor 209 may be included at a position symmetric to N channel MOS transistor 208 about the center line of the bit line pair so as to arrange the parasitic capacitance.

In the case where only a writing capability is provided, the test data latch circuit can include a circuit that constantly outputs an H level, instead of NAND circuits 201 and 204, RS flip-flops RS and RSZ, and NAND circuit 207. This circuit that provides an H level may have its outputs connected to N channel MOS transistor 208 and N channel MOS transistor 209, likewise NAND circuit 207.

(2) The test data reading mode of the present embodiment has been described based on test data of a cell checker arrangement with the memory array having a half pitch cell arrangement. The word lines of one set of word lines WLi (i=4m+1 or 4m+2 (m is an integer of at least 0), and $0 \leq i < 8192$) are sequentially rendered active, and the word lines of another set of word lines WLi (i=4m+1 or 4m+3 (m is an integer of at least 0), and $0 \leq i < 8192$) are also sequentially rendered active. The structure of these sets differs depending upon the test pattern and the memory array cell arrangement. When stored test data are properly read out, a plurality of word lines connected to only the plurality of memory cells that provide the same potential change in each connected bit line pair is to be set as one set. In this case, BL=H and /BL=L, or BL=L and /BL=H with respect to all the bit line pairs. Alternatively, BL=H and /BL=L for a certain bit line pair, and BL=L and /BL=H for another bit line pair may be implemented.

In the case where the stored test data are properly read out, a plurality of word lines connected to only the plurality of memory cells that provide a different potential change to each connected bit line pair can be set as one set. In this case, the logic value applied to input/output terminal DQ is L when the memory cell data are properly read. When data of any of the memory cells could not be properly read, the logic value applied to input/output terminal DQ attains an H level.

(3) In the present embodiment, the bit line to which the output value of H from NAND circuit 207 is applied is switched between BL or /BL in a test data writing mode. Alternatively, the output value of NAND circuit 207 can be switched by a control signal so as to be applied to one of bit lines BL and /BL.

(4) In the present embodiment, the output of NAND circuit 207 is provided to the BL side with N channel MOS transistor 208 rendered conductive in a test data reading mode. Alternatively, N channel MOS transistor 209 can be rendered conductive to provide the output to the /BL side.

(5) In the present embodiment, control circuit 100 carries out the processes of (1)–(10) in the above-described test pattern read out operation based on external signals (/RAS, /CS, /CAS, /WE, CLK, A0–14). However, present invention is not limited thereto. DRAM 10 may include an execution control circuit that provides internal signals similar to the above external signals in a sequence identical to the externally applied signals in (1)–(10). The control circuit can execute the processes of (1)–(10) based on the internal signal.

Second Embodiment

The second embodiment is directed to a DRAM that can evaluate the performance of the sense amplifier. As described in the first embodiment, the potential of the bit line pair is increased/reduced by ΔVs in a data reading mode from a memory cell. Since this ΔVs varies depending upon the temperature or the like, the sense amplifier must properly conduct amplification even if this ΔVs is small. In the present embodiment, a small potential difference is intentionally applied to the bit line pair to evaluate the performance of the sense amplifier based on whether that small potential difference can be amplified or not.

The structure of the DRAM of the present embodiment is basically similar to the structure of the DRAM of the first embodiment shown in FIG. 1. The difference therebetween will be set forth below.

Figure 18:
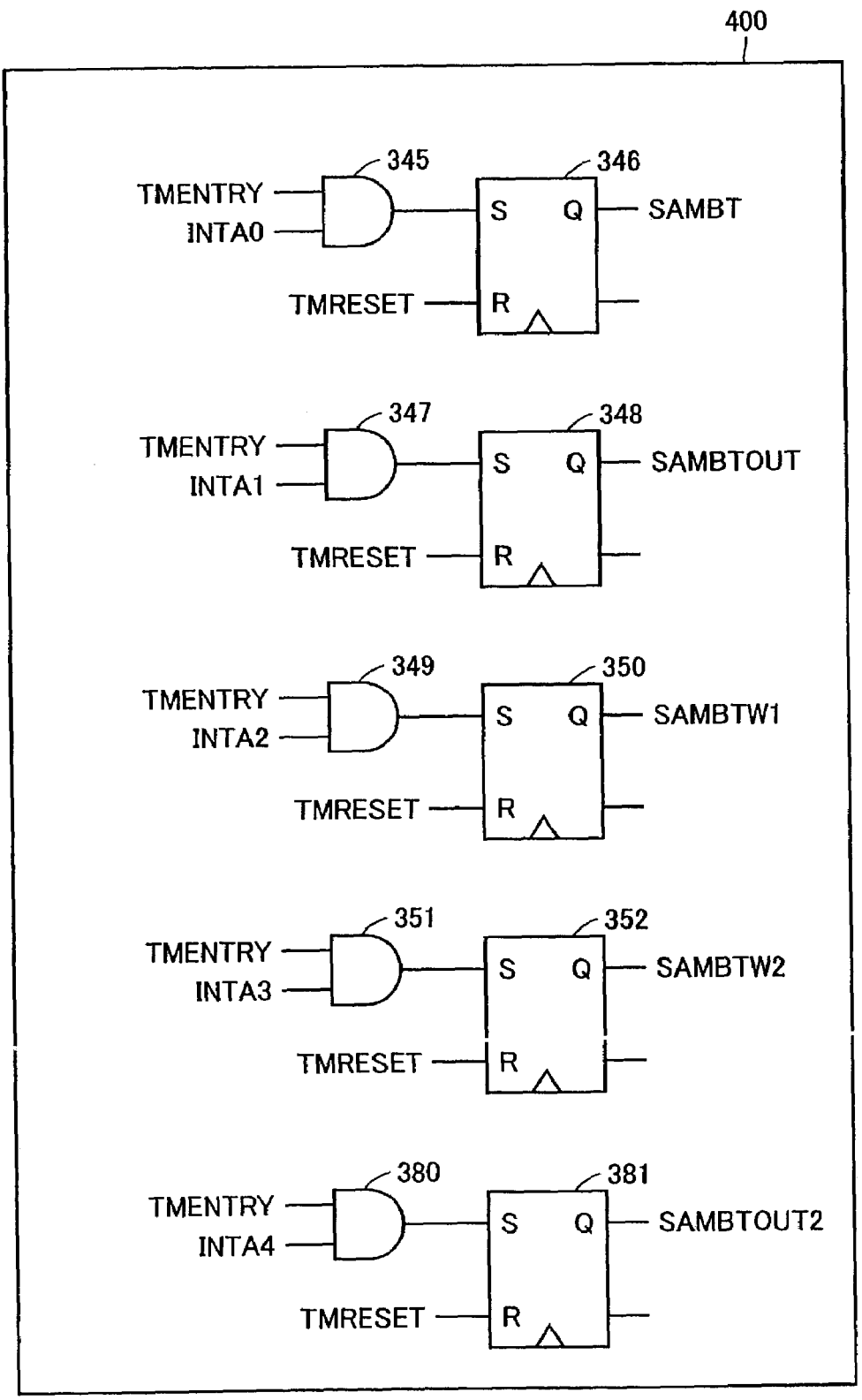
FIG. 18 shows a structure of a test mode type signal generation circuit 400.

In a test mode type signal generation circuit 400 of the present embodiment shown in FIG. 18, the level of SAMBTOUT2 is under control of inverter 380 and RS flip-flop 381.

When TMENTRY=H, INTA4=H and TMRESET=L, SAMBTOUT2 is maintained at an H level (activation level). When TMENTRY=L, INTA4=L and TMRESET=H, SAMBTOUT2 is maintained at an L level (inactivation level). SAMBTOUT2=H indicates that a SAMBTOUT2 test mode is entered. SAMBTOUT2=L indicates that a SAMBTOUT2 test mode is not entered.

Figure 19:
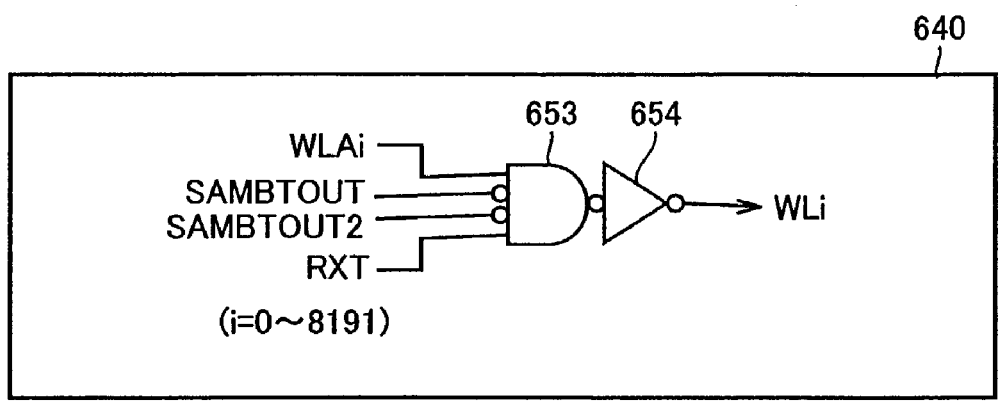
FIG. 19 shows a structure of a WL activation circuit 640.

WL activation circuit 140 of FIG. 19 is connected to a row address signal line WLAi (i=0–8191), and a word line WLi (i=0–8191), and is supplied with a boosted voltage VPP. WL activation circuit 140 includes NAND circuit 653 and inverter 654.

When RXT=H, WLAi=H, SAMBTOUT=L and SAMBTOUT2=L, word line WLi is pulled up to an H level of activation. When the RXT=L, word line WLi is rendered inactive.

When SAMBTOUT or SAMBTOUT2 mode is entered, SAMBTOUT=H or SAMBTOUT2=H. Therefore, the word line is not rendered active.

Figure 20:
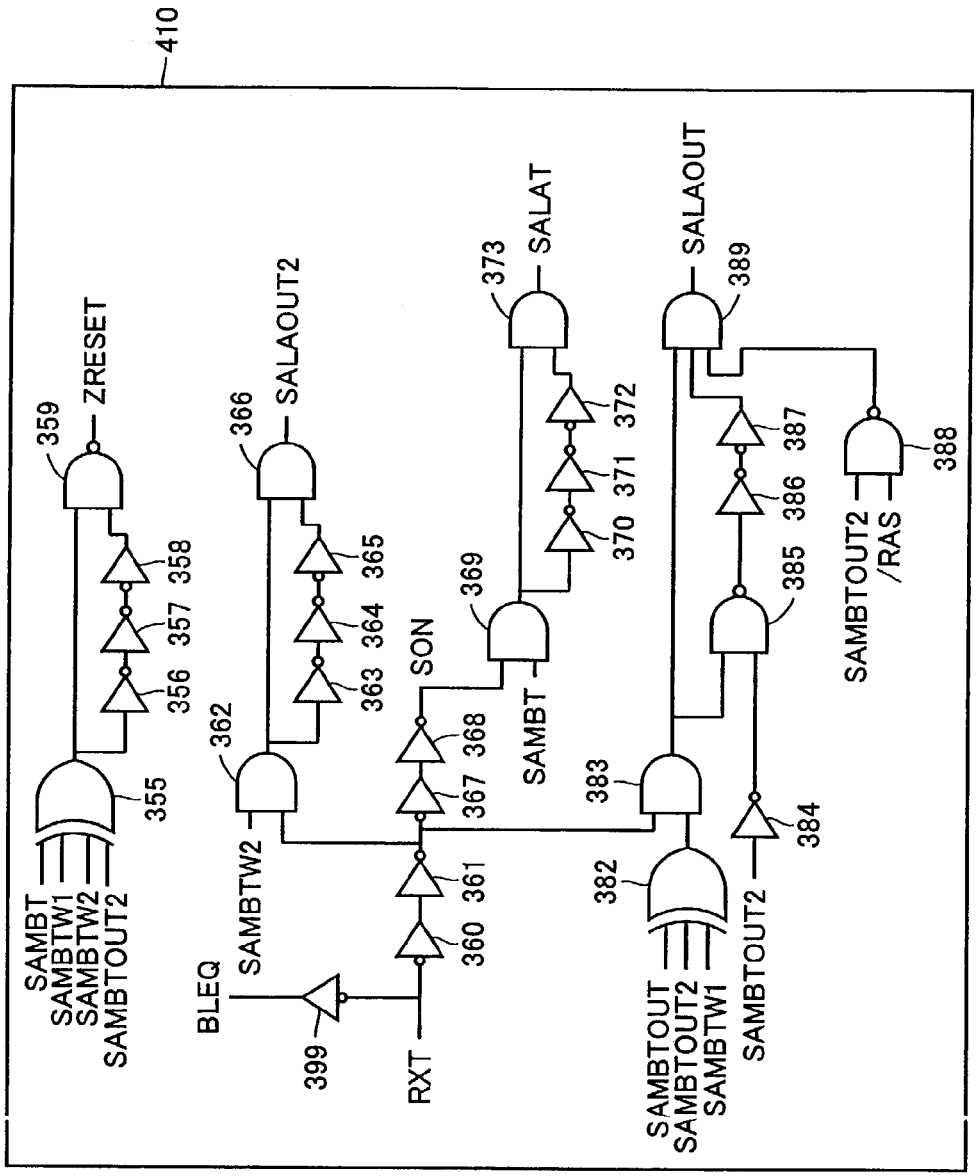
FIG. 20 shows a structure of a test execution control signal generation circuit 410.

Test execution control signal generation circuit 410 of FIG. 20 differs from the test execution control signal generation circuit of the first embodiment shown in FIG. 12 in the following features. Referring to FIG. 20, the level of ZRESET is under control of an ExOR circuit 355, inverters 356, 357, 358 and NAND circuit 359 according to SAMBT, SAMBTW1, SAMBTW2, and SAMBTOUT2. When any of SAMBT, SAMBTW1, SAMBTW2, and SAMBTOUT2 is rendered active of an H level, ZRESET is output as a one shot pulse of L (activation level) in synchronization with that activation.

SALATOUT is under control of inverters 360, 361, ExOR circuit 382, AND circuit 383, inverter 384, NAND circuit 358, inverters 386, 387, NAND circuit 388 and AND circuit 389 according to RXT, SAMBTOUT, SAMBTW1, SAMBTOUT2, and /RAS. When RXT is rendered active of an H level at SAMBTOUT2=H, SALATOUT is output as a one shot pulse of H (activation level) lagging behind that activation. Sense amplifier activation signal SON is output as a one shot pulse of H (activation level) lagging behind the activation of RXT=H. However, SON attains an H level later than SALATOUT attaining an H level depending upon the number of circuit elements connected. Also, the activation of SALATOUT is under control of row address strobe signal /RAS applied to NAND circuit 388. In other words, when /RAS attains an H level, SALATOUT is pulled down to an L level (inactivation level).

Therefore, when time width Δt corresponding to /RAS of an L level is short, the one shot pulse width of SALATOUT will become shorter. A reduced one shot pulse width of SALATOUT will reduce the conducting duration of N channel MOS transistor 208. As a result, the potential increase amount ΔV of bit line BL is reduced.

Generally, sense amplifier 12 amplifies the potential of bit line BL to H and the potential bit line /BL to L by this increase of potential of bit line BL. However, amplifiers of poor performance will not be able to amplify properly if potential increased amount ΔV is too small. Some amplifiers may erroneously amplify the potential of bit line BL to an L level and the potential of bit line /BL to an H level.

Therefore, even if the potential increased amount ΔV is reduced, evaluation can be made that sense amplifiers that can properly amplify have good performance and sense amplifiers that erroneously amplify have poor performance.

Figure 21:
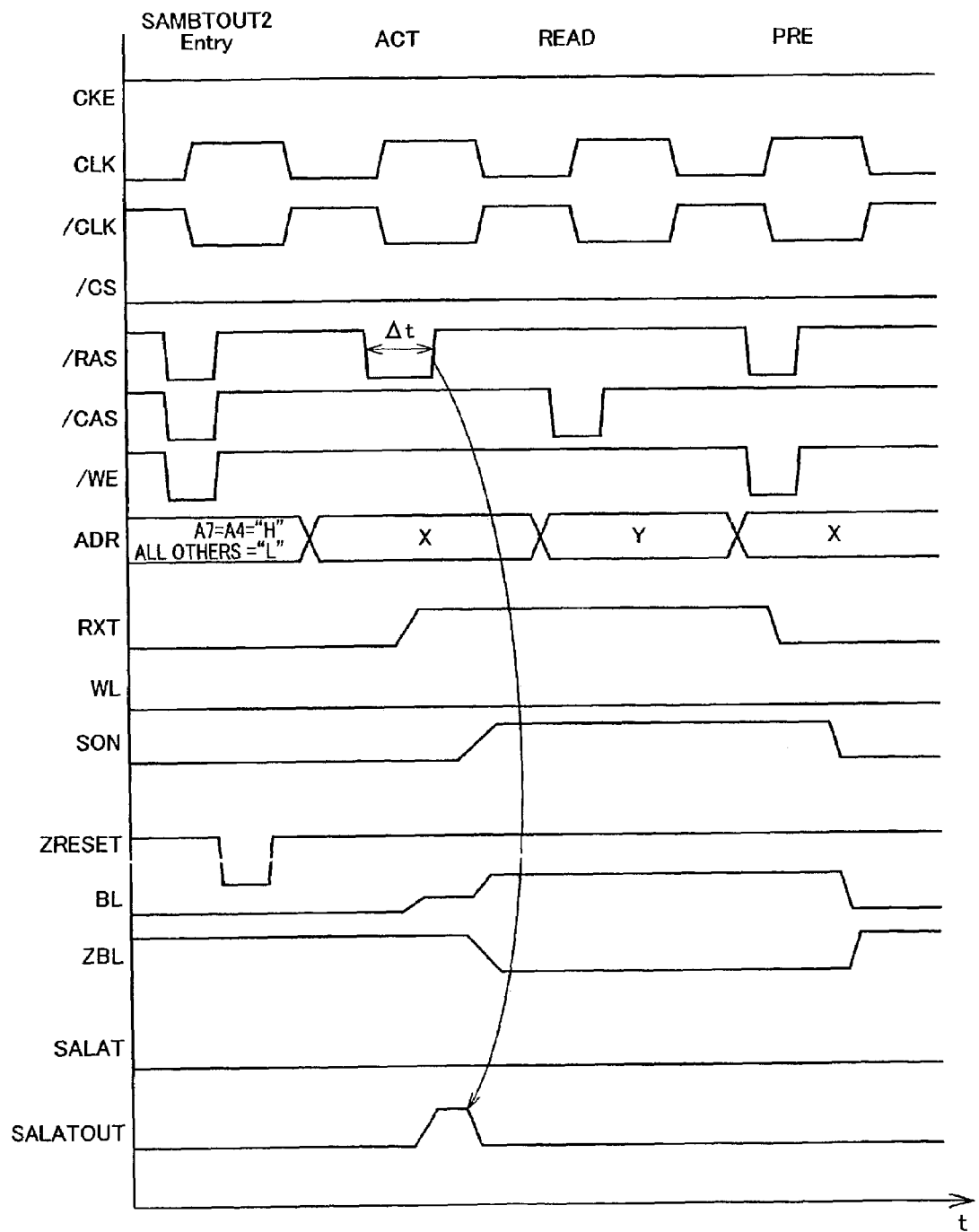
FIG. 21 is a timing chart of a performance test operation of a sense amplifier 12.
Figure 23:
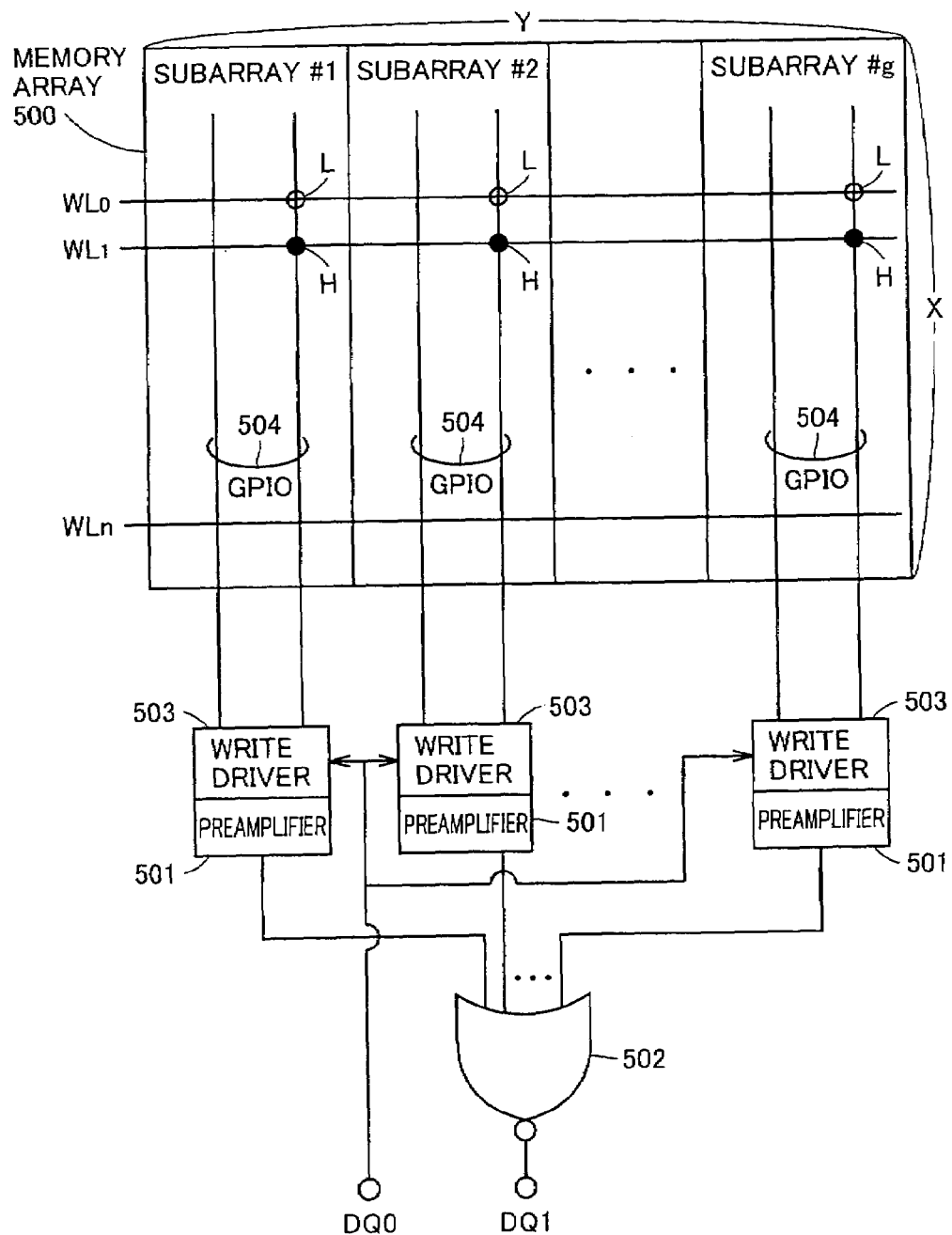
FIG. 23 shows a concept of multibit testing.

The performance test operation of sense amplifier 12 will be described hereinafter with reference to the timing chart of FIG. 21.

(1) First, the time width Δt of /RAS=L is decremented by 1 ns in the range of 10 ns–1 ns. Then, the following processes are repeated.

(2) SAMBTOUT2 Mode Entry

Internal signal generation circuit 120 responds to externally applied /RAS=L, /CAS=L, /WE=L, A4=H and A7=H to output INTZRAS=L, INTZCAS=L, INTZWE=L, INTA4=H and INTA7=H.

Test mode entry/reset circuit 150 responds to INTZRAS=L, INTZCAS=L, INTZWE=L and INTA7=H to output TMENTRY=H.

Test mode type signal generation circuit 400 responds to INTA4=H and TMENTRY=H to latch SAMBTOUT2=H.

Test execution control signal generation circuit 410 responds to SAMBTOUT2=H to output ZRESET=L (one shot pulse).

Reset flip-flop RS responds to ZRESET=L to latch SABLO=L. RS flip-flop RSZ responds to ZRESET=L to latch SAZBLO=L. Accordingly, NAND circuit 207 provides an H output.

(3) ACT

Internal signal generation circuit 120 responds to externally applied /RAS=L, /CAS=H and WE=H to output INTZRAS=L, INTZCAS=H, and INTZWE=H.

Command decode circuit 130 responds to INTZRAS=L, INTZCAS=H, and INTZWE=H to output a row active signal RXT of an H level. WL activation circuit 640 does not pull up word line WLi to an H level by SAMBTOUT2=H.

Test execution control signal generation circuit 410 responds to row active signal RXT of an H level to pull up sense amplifier activation signal SON to an H level. Test execution control signal generation circuit 410 responds to row active signal RXT=H, SAMBTOUT2=H and /RAS=L to pull up SALATOUT to an H level (one shot pulse) before sense amplifier activation signal SON is pulled up to an H level. SALATOUT attains an L level when /RAS=L. Therefore, the pulse width of SALATOUT=H can be adjusted by adjusting time width Δt of /RAS=L.

Since NAND circuit 207 provides an H output, N channel MOS transistor 208 is rendered conductive by SALATOUT=H. Bit line BL attains the level of VDDS/2+ ΔV. A shorter pulse width of SALATOUT=H will reduce the conducting duration of N channel MOS transistor 208. Therefore, ΔV becomes smaller.

By sense amplifier activation signal SON=H, sense amplifier 12 is rendered active. If potential difference ΔV is large enough, sense amplifier 12 amplifies potential difference ΔV, whereby bit lines BL and /BL are driven to an H level and an L level, respectively. However, sense amplifier 12 cannot properly amplify the potential difference ΔV if potential difference ΔV is too small. As a result, BL=H and /BL=L may be achieved which are different results from the original results.

(4) READ Mode

Internal signal generation circuit 120 responds to externally applied /RAS=H, /CAS=L and /WE=H to output INTZRAS=H, INTZCAS=L, and INTZWE=H.

Command decode circuit 130 responds to INTZRAS=H, INTZCAS=L and INTZWE=H to output a read operation designation signal /RE of an H level.

Column decoder 5 responds to read operation designation signal /RE of an H level to accept internal address signals INTA0–14 from column address buffer 3. Column decoder 5 pulls up the potential of column select line CSLj (j=0–32767) to the selected level of H according to the logic states of the 15 bits of internal address signals INTA0–14. Accordingly, N channel MOS transistors 21 and 22 of column select gate 11 connected to that column select line CSLj are rendered conductive, whereby the bit line pair BL and /BL connected to that column select gate is coupled with data input/output line pair GPIO (GIO and /GIO).

In response to /RE=H, preamplifier 101 is rendered active. Since BL=H and /BL=L when sense amplifier 12 amplifies properly, a signal of an H level is provided to input/output terminal DQ. In the case where sense amplifier 12 has amplified erroneously, BL=L and /BL=H are achieved, whereby an L output is provided to input/output terminal DQ.

(5) The above process of (4) is repeated 32768 times with the value j of column select line CSLj (j=0–32767) altered.

(6) PRE Mode

Internal signal generation circuit 120 responds to externally applied /RAS=L, /CAS=H and /WE=L to output INTZRAS=L, INTZCAS=H, and INTZWE=L.

Command decode circuit 130 responds to INTZRAS=L, INTZCAS=H, and INTZWE=L to latch row active signal RXT=L.

Test execution control signal generation circuit 410 responds to row active signal RXT=L to pull up bit line equalize signal BLEQ to an H level. In response, equalizer 13 is rendered active. As a result, the potentials of bit lines BL and /BL attain a fixed state of the level of VBL (=VDDS/2).

Test execution control signal generation circuit 410 also pulls down sense amplifier activation signal SON to an L level by row active signal RXT of an L level.

Examples of the performance test results of sense amplifier 12 will be described with reference to FIGS. 22A, 22B and 22C that represent the data provided to input/output terminal DQ, i.e. the data read out when Δt is altered.

It is appreciated from the results of sense amplifier A of FIG. 22A that all the levels read out are H (correct results) at 10 ns–1 ns with sense amplifier A. Therefore, evaluation can be made that sense amplifier A is of good performance.

It is appreciated from the results of sense amplifier B shown in FIG. 22B that the read out data attains an L level (erroneous result) when Δt becomes as small as 2 ns. Therefore, evaluation can be made that sense amplifier B is of inferior performance.

It is appreciated from the results of sense amplifier C shown in FIG. 22C that the data read out varies between an H level (correct result) and an L level (erroneous result) when Δt becomes as small as 2 ns. Therefore, evaluation can be made that the performance of sense amplifier C is inferior.

In the second embodiment, the potential change of a pair of bit lines is intentionally made small based on a structure similar to that of the first embodiment to evaluate the performance of the sense amplifier.

The present invention is not limited to the above embodiments, and may include modifications set forth below.

(1) Although the DRAM of the present embodiment includes a sense amplifier performance evaluation capability in addition to the test data writing and reading capability of the first embodiment, the DRAM of the second embodiment may include only the sense amplifier performance evaluation capability.

(2) SALATOUT may be rendered active by a boosted voltage VPP, likewise the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device with a test mode carrying out testing of reading out data from a memory cell, said semiconductor memory device comprising:
   a first circuit provided corresponding to a bit line pair, having data of both bit lines of said bit line pair input a plurality of times to output a first logic value when said data of each bit line input a plurality of times are all the same data, and to output a second logic value when said input data indicates different data;
   a first control circuit sequentially rendering active a plurality of word lines connected to a plurality of memory cells such that data of a bit line pair corresponding to said memory cell is sequentially input to said first circuit; and
   a second control circuit sending an output of said first circuit to one bit line of said bit line pair to output data corresponding to potentials of said bit line pair after a process under control of said first control circuit ends, wherein
   said first control circuit renders active a first control signal after a sense amplifier is rendered active,
   said first circuit comprises a logic circuit and a flip-flop corresponding to each bit line of said bit line pair, and
   said logic circuit to which data of a corresponding bit line and said first control signal are input to provide data of said bit line to a set input terminal of said flip-flop in response to activation of said first control signal.

2. The semiconductor memory device according to claim 1, wherein said first control circuit responds to a predetermined external signal to render active a row active signal, and renders active said first control signal by outputting said first control signal as a one shot pulse lagging behind activation of said row active signal.

3. A semiconductor memory device with a test mode carrying out testing of reading out data from a memory cell, said semiconductor memory device comprising:
   a first circuit provided corresponding to a bit line pair, having data of both bit lines of said bit line pair input a plurality of times to output a first logic value when said data of each bit line input a plurality of times are all the same data, and to output a second logic value when said input data indicates different data;
   a first control circuit sequentially rendering active a plurality of word lines connected to a plurality of memory cells such that data of a bit line pair corresponding to said memory cell is sequentially input to said first circuit; and
   a second control circuit sending an output of said first circuit to one bit line of said bit line pair to output data corresponding to potentials of said bit line pair after a process under control of said first control circuit ends,
   wherein said first circuit comprises
   two flip-flop having data of both bit lines applied to a set input terminal at every activation of one word line,
   a logic circuit to which outputs of said two flip-flops are input, and
   a switch provided between an output of said logic circuit and one bit line of said bit line pair, and rendered conductive in response to activation of a second control signal,
   said second control circuit rendering said second control signal active prior to activation of a sense amplifier after a process under control of said first control circuit ends.

4. The semiconductor memory device according to claim 3, wherein said second control circuit renders a row active signal active in response to a predetermined external signal, and renders said second control signal active by outputting said second control signal as a one shot pulse lagging behind activation of said row active signal.

5. The semiconductor memory device according to claim 4, wherein said second control circuit renders said second control signal active by a voltage used to boost a word line.

* * * * *